(12) United States Patent
Reis et al.

(10) Patent No.: US 10,676,360 B2
(45) Date of Patent: Jun. 9, 2020

(54) SEPARATION OF SEMI-CONDUCTING AND METALLIC SINGLE-WALLED CARBON NANOTUBES USING A POLYTUNGSTATE

(71) Applicant: CLAP Co., Ltd., Seoul (KR)

(72) Inventors: Wieland Reis, Heidelberg (DE); Alexander Kraus, Pittenhart (DE); Jules Mikhael, Mannheim (DE); Michael Kaiser, Hettenleidelheim (DE); Matthias Georg Schwab, Mannheim (DE); Thomas Weitz, Mannheim (DE); Michel Kettner, Mannheim (DE)

(73) Assignee: CLAP Co., Ltd., Seoul (KR)

( * ) Notice: Subject to any disclaimer, the term of this patent is extended or adjusted under 35 U.S.C. 154(b) by 345 days.

(21) Appl. No.: 15/513,218

(22) PCT Filed: Sep. 22, 2015

(86) PCT No.: PCT/EP2015/071640
§ 371 (c)(1),
(2) Date: Mar. 22, 2017

(87) PCT Pub. No.: WO2016/046153
PCT Pub. Date: Mar. 31, 2016

(65) Prior Publication Data
US 2017/0305745 A1    Oct. 26, 2017

(30) Foreign Application Priority Data

Sep. 23, 2014 (EP) ..................................... 14185950

(51) Int. Cl.
*C01B 32/172* (2017.01)
*H01L 51/00* (2006.01)
(Continued)

(52) U.S. Cl.
CPC ........ *C01B 32/172* (2017.08); *H01L 51/0048* (2013.01); *C01B 2202/22* (2013.01);
(Continued)

(58) Field of Classification Search
CPC .............. C01B 32/172; C01B 2202/22; H01L 51/0048; H01L 51/0545; G01N 21/33; Y02E 10/529; B82Y 30/00; B82Y 40/00
See application file for complete search history.

(56) References Cited

U.S. PATENT DOCUMENTS

| 5,738,222 A | 4/1998 | Pagenkopf et al. |
| 9,126,866 B2 | 9/2015 | Dengler et al. |

(Continued)

FOREIGN PATENT DOCUMENTS

| CN | 101977498 A | 2/2011 |
| CN | 103537293 A | 1/2014 |
| DE | 43 09 325 A1 | 9/1994 |

OTHER PUBLICATIONS

Feng, Ye, et al. "High-efficiency separation of single-wall carbon nanotubes by self-generated density gradient ultracentrifugation." The Journal of Physical Chemistry C 115.5 (2011): 1752-1756.*
(Continued)

*Primary Examiner* — Richard M Rump
(74) *Attorney, Agent, or Firm* — Oblon, McClelland, Maier & Neustadt, L.L.P.

(57) ABSTRACT

The present invention relates to a method for separating semi-conducting and metallic single-walled carbon nanotubes from each other and, if present, from other carbonaceous material, or for separating semi-conducting or metallic single-walled carbon nanotubes from other carbonaceous material via density separation using a solution of a polytungstate; to semi-conducting or metallic single-walled carbon nanotubes obtained by this method; and to the use of
(Continued)

these semi-conducting or metallic single-walled carbon nanotubes. The invention further relates to the use of a polytungstate, particularly sodium polytungstate, for separating semi-conducting single-walled carbon nanotubes from metallic single-walled carbon nanotubes, or for separating semi-conducting single-walled carbon nanotubes from undesired carbonaceous material, particularly from metallic single-walled carbon nanotubes, or for separating metallic single-walled carbon nanotubes from undesired carbonaceous material, particularly from semi-conducting single-walled carbon nanotubes. The invention also relates to specific polyarylethers containing phosphate groups and their use as surface-active compounds.

23 Claims, 5 Drawing Sheets

(51) Int. Cl.
H01L 51/05 (2006.01)
G01N 21/33 (2006.01)
(52) U.S. Cl.
CPC .......... G01N 21/33 (2013.01); H01L 51/0545 (2013.01); Y02E 10/549 (2013.01)

(56) References Cited

U.S. PATENT DOCUMENTS

| | | |
|---|---|---|
| 2010/0163462 A1 | 7/2010 | Grabbe et al. |
| 2010/0331186 A1 | 12/2010 | Kozuki |
| 2012/0024761 A1 | 2/2012 | Grabbe et al. |
| 2012/0027660 A1 | 2/2012 | Grabbe et al. |

OTHER PUBLICATIONS

Lu, Qi, et al. "Determination of carbon nanotube density by gradient sedimentation." The Journal of Physical Chemistry B 110.48 (2006): 24371-24376.*

Bonaccorso, F., et al. "Density gradient ultracentrifugation of nanotubes: Interplay of bundling and surfactants encapsulation." The Journal of Physical Chemistry C 114.41 (2010): 17267-17285.*
International Search Report dated Oct. 19, 2015 in PCT/EP2015/071640.
Michael S. Arnold et al., "Sorting carbon nanotubes by electronic structure using density differentiation", Nature Nanotechnology, vol. 1, XP002512670, Oct. 4, 2006, pp. 60-65.
Ashok Kumar Sundramoorthy et al., "Scalable and Effective Enrichment of Semiconducting Single-Walled Carbon Nanotubes by a Dual Selective Naphthalene-Based Azo Dispersant", Journal of the American Chemical Society, vol. 135, No. 15, XP055185678, Apr. 17, 2013, pp. 5569-5581.
Alicia Maroto et al., "Functionalized Metallic Carbon Nanotube Devices for pH Sensing", ChemPhysChem—European Journal Of Chemical Physics & Physicalchemistry, vol. 8, No. 2, XP055218728, Feb. 2, 2007, pp. 220-223.
Xiao Liu et al., "Study on Novel Carbon-Nanotube/Sulfonated Poly(Aryl Ether Ketone) Composites With High Dielectric Constant at Low Percolation Threshold", Soft Materials, vol. 9, No. 1, XP002745489, Jan. 3, 2011, pp. 94-103 (with cover page).
U.S. Appl. No. 15/503,242, filed Feb. 10, 2017, Zhenan Bao.
Alexander L. Antaris et al., "Sorting Single-Walled Carbon Nanotubes by Electronic Type Using Nonionic, Biocompatible Block Copolymers" ACSNano, vol. 4, No. 8, 2010, pp. 4725-4732.
Saunab Ghosh et al., "Advanced sorting of single-walled carbon nanotubes by nonlinear density-gradient ultracentrifugation", Nature Nanotechnology, May 9, 2010, 5(6), 8 pages.
Kazuhiro Yanagi et al., "Separations of Metallic and Semiconducting Carbon Nanotubes by Using Sucrose as a Gradient Medium", Journal of Physical Chemistry C, 112, 2008, pp. 18889-18894.
Alexander A. Green et al., "Nearly Single-Chirality Single-Walled Carbon Nanotubes Produced via Orthogonal Iterative Density Gradient Ultracentrifugation", Advanced Materials, 23, 2011, pp. 2185-2190.
Bodo Plewinsky et al., "Sodium metatungstate, a new medium for binary and ternary density gradient centrifugation", Makromol. Chem. 185, 1984, pp. 1429-1439.
Murray R. Gregory et al., "A nontoxic substitute for hazardous heavy liquids—aqueous sodium polytungstate ($3Na_2WO_4 \cdot 9WO_3 \cdot H_2O$) solution (Note)" New Zealand Journal of Geology and Geophysics, vol. 30, 1987, pp. 317-320 (with cover page).

* cited by examiner

SEPARATION OF SEMI-CONDUCTING AND METALLIC SINGLE-WALLED CARBON NANOTUBES USING A POLYTUNGSTATE

This application is a National Stage of PCT/EP2015/071640, which was filed on Sep. 22, 2015. This application is based on and claims the benefit of priority to European application No. 14185950.4, which was filed on Sep. 23, 2014.

The present invention relates to a method for separating semi-conducting and metallic single-walled carbon nanotubes from each other and, if present, from other carbonaceous material, or for separating semi-conducting single-walled carbon nanotubes or metallic single-walled carbon nanotubes from other carbonaceous material via density separation using a solution of a polytungstate; to semi-conducting single-walled carbon nanotubes obtainable by this method; and to the use of these semi-conducting single-walled carbon nanotubes e.g. in electronic devices, optical devices, optoelectronic devices, energy storage devices and the like; as well as to metallic single-walled carbon nanotubes obtainable by this method; and to their use. The invention further relates to the use of a polytungstate, in particular sodium polytungstate, for separating semi-conducting single-walled carbon nanotubes from metallic single-walled carbon nanotubes, or for separating semi-conducting single-walled carbon nanotubes from undesired carbonaceous material, in particular from metallic single-walled carbon nanotubes, or for separating metallic single-walled carbon nanotubes from undesired carbonaceous material, in particular from semi-conducting single-walled carbon nanotubes. The invention also relates to specific polyarylethers containing phosphate groups and their use as surface-active compounds.

Carbon nanotubes (CNTs) are allotropes of carbon with a cylindrical nanostructure and are members of the fullerene structural family. Their name is derived from their long, hollow structure with the walls formed by one-atom-thick sheets of carbon, i.e. by graphene. These sheets are rolled at specific and discrete ("chiral") angles, and the combination of the rolling angle and radius decides the nanotube properties; for example, whether the individual nanotube shell shows a metal or semiconductor behavior. Carbon nanotubes are generally categorized as single-walled carbon nanotubes (SWCNTs; often just SWNTs) and multi-walled carbon nanotubes (MWCNTs; often just MWNTs).

The structure of an SWNT can be conceptualized by wrapping a one-atom-thick layer of graphene into a seamless cylinder. As a result of this structure, SWNTs are available in a large number of different chiralities due to various combinations of diameter and wrapping angle. The nanotube chirality defines both its electronic and optical properties, and hence is a critical parameter when incorporating nanotubes into device applications. For instance, roughly two thirds of SWNT chiralities are semiconducting, while the rest are of metallic nature. Moreover, the first-order peaks in optical absorbance for metallic SWNTs can vary widely from about 450 nm to 700 nm as SWNT diameter is increased from 0.7 nm to 1.4 nm. Although this striking dependence between SWNT atomic structure and behavior enables them to be employed in many ways, it is also regarded as one of their major weaknesses, as so far there are no practical methods of synthesizing SWNTs of uniform chirality. Instead, as-synthesized SWNTs typically consist of a mixture of semiconducting and metallic nanotubes with varying diameters.

The slight difference in the angle at which semiconducting and metallic nanotubes are rolled up into a seamless cylinder also results in subtle differences in density. These different densities are the general principle for separating semiconducting and metallic nanotubes. The buoyant densities of SWNTs in aqueous solution subtly depend on factors such as the mass and volume of the SWCNT itself, its surface functionalization and charge, coverage with surface-active compounds and electrostatically bound hydration layers. The differences in the buoyant densities result into different positions of the SWNTs within a density gradient medium when they are subjected to high centripetal forces.

In the separation methods so far used, either both electrical types of SWNTs (semi-conducting and metallic) are functionalized with standard surfactants, such as sodium cholate or sodium dodecyl sulfate, or just one type, mostly the semi-conducting SWNT, is functionalized with specific additives. This (partial) functionalization enhances the difference in the densities of the various SWNT types. The (partly) functionalized SWNTs are then subjected to a density gradient ultracentrifugation (DGU). Under high gravitational forces the nanomaterials are driven by density differences to positions where their buoyant density is equal to that of the surrounding fluid (isopycnic point). Density gradient media so far used for SWCNT separation are aqueous solutions of sugar(-like) molecules, such as sucrose, polysucrose, Nycodenz® (5-(N-2,3-dihydroxypropylacetamido)-2,4,6-tri-iodo-N—N'-bis(2,3-dihydroxypropyl) isophthalamide; iohexol) or iodixanol (5-{N-[3-(N-{3,5-bis[(2,3-dihydroxypropyl)carbamoyl]-2,4,6-triiodophenyl}-acetamido)-2-hydroxypropyl]acetamido}-1-N,3-N-bis(2,3-dihydroxypropyl)-2,4,6-triiodobenzene-1,3-dicarboxamide). Another density gradient medium used for SWCNT separation is Percoll® (GE Healthcare), which consists of colloidal silica particles of 15-30 nm diameter (23% w/w in water) coated with polyvinylpyrrolidone.

M. S. Arnold, A. A. Green, J. F. Hulvat, S. I. Stupp and M. C. Hersam describe in Nature Nanotechnology, 2006, 1, 60-65 the separations of CNTs by density gradient centrifugation. Sodium dodecyl sulfate, sodium dodecyl benzene sulfonate, sodium cholate, sodium deoxycholate and sodium taurodeoxycholate are used for dispersing/functionalizing the nanotubes. The density medium is an aqueous solution of iodixanol.

A. L. Antaris, J.-W. T. Seo, A. A. Green and M. C. Hersam describe in ACSNano, 2010, 4(8), 4725-4732 the separations of CNTs by non-linear density gradient centrifugation using Pluronics® (linear copolymers with a central polypropylene oxide (PPO) block flanked by two polyethylene (PEO) blocks) and Tetronics® (X-shaped copolymers with four PPO-PEO blocks bonded to a central ethylene diamine linker) as surfactants and an aqueous solution of iodixanol as density medium.

S. Ghosh, S. M. Bachilo ad R. B. Weisman describe in Nature Nanotechnology, 2010, 5(6), 443-450 the separations of CNTs by non-linear density gradient centrifugation. The density medium is an aqueous solution of iodixanol further containing the surfactant sodium cholate. This surfactant is also used for dispersing/functionalizing the nanotubes.

K. Yanagi, T. Iitsuka, S. Fujii and H. Kataura, J. Phys. Chem. 2008, 112, 11889-18894 use sucrose as density medium.

A. A. Green and M. C. Hersam, Advanced Materials 2011, 23, 2185-2190 produce nearly single-chirality single-walled CNTs via orthogonal iterative DGU using sodium dodecyl sulfate in combination with sodium cholate as surfactants and iodixanol as density medium.

The disadvantage of the separation methods of the prior art is the laborious, time-consuming preparation of the density gradients. Moreover, satisfactory separations are only obtained after protracted centrifugation times and require high rotational speeds (e.g. 55,000 revolutions per minute; rpm). The resulting bands containing the enriched SWNT forms are often small and diffuse and thus very difficult to separate. This impedes separation on a higher scale. Also, the viscosity sharply increases with increasing concentration of the density gradient medium. A high viscosity hampers the movement of the nanomaterials to their corresponding isopycnic point, which makes the separation methods of the prior art particularly time-consuming.

Solid sodium polytungstate (SPT), or sodium metatungstate (synonymous), $3Na_2WO_4.9WO_3.H_2O$ or $Na_6[H_2W_{12}O_{40}]$, is a 12-fold aggregated isopolytungstate with a molar mass of 2986.12 g/mol. The structure of polytungstate is modelled using octahedra in which the oxygen atoms are located at the corners and the tungsten atoms at the center of the octahedra. When represented as a spherical model, the oxygen atoms form a dense spherical shell while the tungsten atoms fill the open spaces in the octahedra. Because of this structure this substance may be considered a true metatungstate, represented structurally as $Na_6[H_2W_{12}O_{40}]$. In true metatungstates, both of the protons are located in the central empty space of the polyanion and are unable to penetrate the external shell of the spherical casing. Solid SPT has the form of white crystals and aqueous SPT is a light yellow-green transparent solution. Due to its very high solubility in water (max. density 3.1 g/cm$^3$), SPT is widely used as a heavy liquid for gravity separation (sink swim analysis) and density gradient centrifugation mainly used in the mineral industry (B. Plewinsky, R. Kamps, Makromol. Chem 1984, 185, 1429-1439; M. R. Gregory, K. A. Johnston, New Zealand Journal of Geology and Geophysics, 1987, 30, 317-320). Aqueous SPT is non-toxic, non-flammable, non-corrosive, odorless, environmentally benign and reusable. Additionally it has a low viscosity, even at high concentrations.

The object of the present invention was to provide a method for separating semi-conducting single-walled carbon nanotubes from other carbonaceous material, in particular from metallic single-walled carbon nanotubes, which is simpler, less tedious and less energy- and/or time-consuming than the prior art methods using DGU. Another aspect of the object of the present invention was to provide a method for separating semi-conducting single-walled carbon nanotubes and metallic single-walled carbon nanotubes from each other, which is simpler, less tedious and less energy- and/or time-consuming than the prior art methods using DGU. Yet another aspect of the object of the present invention was to provide a method for separating metallic single-walled carbon nanotubes from other carbonaceous material, in particular from semi-conducting single-walled carbon nanotubes, which is simpler, less tedious and less energy- and/or time-consuming than the prior art methods using DGU.

Surprisingly, polytungstates, especially SPT, proved to be a useful separation medium which overcomes the disadvantages of the prior art methods.

The invention thus relates to a method for separating semi-conducting and metallic single-walled carbon nanotubes from each other and, if present, from other carbonaceous material, or for separating either semi-conducting single-walled carbon nanotubes or metallic single-walled carbon nanotubes from other carbonaceous material, which method comprises bringing a composition containing semi-conducting and metallic single-walled carbon nanotubes and optionally other carbonaceous material, or a composition containing semi-conducting carbon nanotubes and other carbonaceous material, in particular metallic single-walled carbon nanotubes, or a composition containing metallic single-walled carbon nanotubes and optionally other carbonaceous material, in particular semi-conducting single-walled carbon nanotubes, into contact with at least one surface-active compound and with a solution of a polytungstate, and subjecting the obtained composition to a density separation step.

The invention thus relates in one aspect to a method for separating semi-conducting and metallic single-walled carbon nanotubes from each other and, optionally and if present, from other carbonaceous material, which method comprises bringing a composition containing semi-conducting and metallic single-walled carbon nanotubes and optionally other carbonaceous material into contact with at least one surface-active compound and with a solution of a polytungstate, and subjecting the obtained composition to a density separation step; and in another aspect, the invention relates to a method for separating semi-conducting single-walled carbon nanotubes from other carbonaceous material, which method comprises bringing a composition containing semi-conducting carbon nanotubes and other carbonaceous material, in particular metallic single-walled carbon nanotubes, into contact with at least one surface-active compound and with a solution of a polytungstate, and subjecting the obtained composition to a density separation step; and in yet another aspect, the invention relates to a method for separating metallic single-walled carbon nanotubes from other carbonaceous material, which method comprises bringing a composition containing metallic carbon nanotubes and other carbonaceous material, in particular semi-conducting single-walled carbon nanotubes, into contact with at least one surface-active compound and with a solution of a polytungstate, and subjecting the obtained composition to a density separation step.

Preferably, the invention relates to a method for separating semi-conducting single-walled carbon nanotubes from other carbonaceous material, which method comprises bringing a composition containing semi-conducting carbon nanotubes and other carbonaceous material, in particular metallic single-walled carbon nanotubes, into contact with at least one surface-active compound and with a solution of a polytungstate, and subjecting the obtained composition to a density separation step.

The invention thus also relates to a method for obtaining semi-conducting single-walled carbon nanotubes, which method comprises bringing a composition containing semi-conducting single-walled carbon nanotubes and undesired carbonaceous material into contact with at least one surface-active compound and then with a solution of a polytungstate, and subjecting the obtained composition to a density separation step.

The invention further relates to a method for obtaining metallic single-walled carbon nanotubes, which method comprises bringing a composition containing metallic single-walled carbon nanotubes and undesired carbonaceous material into contact with at least one surface-active compound and then with a solution of a polytungstate, and subjecting the obtained composition to a density separation step.

The method of the invention using a polytungstate as a separation medium can be used for obtaining either preferentially semi-conducting single-walled carbon nanotubes or metallic single-walled carbon nanotubes or both. Whether semi-conducting or metallic single-walled carbon nanotubes are preferentially obtained depends on the specific separation conditions, especially the surface-active compound used. Using specific separation conditions and/or combining two or more separations steps also allows to obtain both semi-conducting or metallic single-walled carbon nanotubes in comparable purities. Further details are given below.

In a preferred embodiment, however, the method of the invention serves for obtaining semi-conducting single-walled carbon nanotubes.

The organic moieties mentioned in the below definitions of the variables are—like the term halogen—collective terms for individual listings of the individual group members. The prefix $C_n$-$C_m$ indicates in each case the possible number of carbon atoms in the group.

The term halogen denotes in each case fluorine, bromine, chlorine or iodine, in particular fluorine, chlorine or bromine.

The term "alkyl" as used herein and in the alkyl moieties of alkoxy, alkylthio, alkylsulfonyl, alkylcarbonyl, alkoxycarbonyl etc. refers to saturated straight-chain or branched hydrocarbon radicals having 1 to 4 ("$C_1$-$C_4$-alkyl") or 1 to 10 ("$C_1$-$C_{10}$-alkyl") or 1 to 20 ("$C_1$-$C_{20}$-alkyl") or 10 to 20 ("$C_{10}$-$C_{20}$-alkyl") or 2 ("$C_2$-alkyl") or 2 to 3 ("$C_2$-$C_3$-alkyl") or 2 to 5 ("$C_2$-$C_3$-alkyl") carbon atoms. $C_1$-$C_4$-Alkyl is methyl, ethyl, n-propyl, isopropyl, n-butyl, 1-methylpropyl (sec-butyl), 2-methylpropyl (isobutyl) or 1,1-dimethylethyl (tert-butyl). $C_1$-$C_{10}$-Alkyl is additionally also, for example, pentyl, 1-methylbutyl, 2-methylbutyl, 3-methylbutyl, 2,2-dimethylpropyl, 1-ethylpropyl, 1,1-dimethylpropyl, 1,2-dimethylpropyl, hexyl, 1-methylpentyl, 2-methylpentyl, 3-methylpentyl, 4-methylpentyl, 1,1-dimethylbutyl, 1,2-dimethylbutyl, 1,3-dimethylbutyl, 2,2-dimethylbutyl, 2,3-dimethylbutyl, 3,3-dimethylbutyl, 1-ethylbutyl, 2-ethylbutyl, 1,1,2-trimethylpropyl, 1,2,2-trimethylpropyl, 1-ethyl-1-methylpropyl, 1-ethyl-2-methylpropyl, heptyl, octyl, 2-ethylhexyl, nonyl, decyl and positional isomers thereof. $C_1$-$C_{20}$-Alkyl is additionally also, for example, undecyl, dodecyl, tridecyl, tetradecyl, pentadecyl, hexadecyl, heptadecyl, octadecyl, nonadecyl, eicosyl and positional isomers thereof. Examples for $C_{10}$-$C_{20}$-alkyl are decyl, undecyl, dodecyl, tridecyl, tetradecyl, pentadecyl, hexadecyl, heptadecyl, octadecyl, nonadecyl, eicosyl and positional isomers thereof. $C_2$-Alkyl is ethyl. $C_2$-$C_3$-Alkyl is ethyl, n-propyl or isopropyl. $C_2$-$C_5$-Alkyl is additionally also, for example, n-butyl, 1-methylpropyl (sec-butyl), 2-methylpropyl (isobutyl), 1,1-dimethylethyl (tert-butyl), pentyl, 1-methylbutyl, 2-methylbutyl, 3-methylbutyl, 2,2-dimethylpropyl, 1-ethylpropyl, 1,1-dimethylpropyl or 1,2-dimethylpropyl.

The term "haloalkyl" as used herein refers to straight-chain or branched alkyl groups having 1 to 4 ("$C_1$-$C_4$-haloalkyl") carbon atoms (as mentioned above), where some or all of the hydrogen atoms in these groups are replaced by halogen atoms as mentioned above. Examples are chloromethyl, bromomethyl, dichloromethyl, trichloromethyl, fluoromethyl, difluoromethyl, trifluoromethyl, chlorofluoromethyl, dichlorofluoromethyl, chlorodifluoromethyl, 1-chloroethyl, 1-bromoethyl, 1-fluoroethyl, 2-fluoroethyl, 2,2-difluoroethyl, 2,2,2-trifluoroethyl, 2-chloro-2-fluoroethyl, 2-chloro-2,2-difluoroethyl, 2,2-dichloro-2-fluoroethyl, 2,2,2-trichloroethyl, pentafluoroethyl, 1-fluoropropyl, 2-fluoropropyl, 3-fluoropropyl, 1,1-difluoropropyl, 2,2-difluoropropyl, 1,2-difluoropropyl, 3,3-difluoropropyl, 3,3,3-trifluoropropyl, heptafluoropropyl, 1,1,1-trifluoroprop-2-yl, 3-chloropropyl, 4-chlorobutyl and the like.

$C_1$-$C_4$-Hydroxyalkyl is a $C_1$-$C_4$-alkyl group as defined above wherein one of the hydrogen atoms is replaced by an OH group. Examples are hydroxymethyl, 1-hydroxyethyl, 2-hydroxyethyl, 1-hydroxypropyl, 2-hydroxypropyl, 3-hydroxypropyl, 1-hydroxy-1-methylethyl, 2-hydroxy-1-methylethyl, 1-hydroxybutyl, 2-hydroxybutyl, 3-hydroxybutyl, 4-hydroxybutyl and the like.

The term "$C_1$-$C_4$-alkoxy" is a $C_1$-$C_4$-alkyl group, as defined above, attached via an oxygen atom. The term "$C_1$-$C_{10}$-alkoxy" is a $C_1$-$C_{10}$-alkyl group, as defined above, attached via an oxygen atom. $C_1$-$C_4$-Alkoxy is methoxy, ethoxy, n-propoxy, 1-methylethoxy (isopropoxy), butoxy, 1-methylpropoxy (sec-butoxy), 2-methylpropoxy (isobutoxy) or 1,1-dimethylethoxy (tert-butoxy). $C_1$-$C_{10}$-Alkoxy is additionally, for example, pentoxy, 1-methylbutoxy, 2-methylbutoxy, 3-methylbutoxy, 1,1-dimethylpropoxy, 1,2-dimethylpropoxy, 2,2-dimethylpropoxy, 1-ethylpropoxy, hexoxy, 1-methylpentoxy, 2-methylpentoxy, 3-methylpentoxy, 4-methylpentoxy, 1,1-dimethylbutoxy, 1,2-dimethylbutoxy, 1,3-dimethylbutoxy, 2,2-dimethylbutoxy, 2,3-dimethylbutoxy, 3,3-dimethylbutoxy, 1-ethylbutoxy, 2-ethylbutoxy, 1,1,2-trimethylpropoxy, 1,2,2-trimethylpropoxy, 1-ethyl-1-methylpropoxy, 1-ethyl-2-methylpropoxy, heptyloxy, octyloxy, 2-ethylhexyloxy, nonyloxy, decyloxy and positional isomers thereof.

The term "$C_1$-$C_4$-haloalkoxy" is a $C_1$-$C_4$-haloalkyl group, as defined above, attached via an oxygen atom. $C_1$-$C_4$-Haloalkoxy is, for example, $OCH_2F$, $OCHF_2$, $OCF_3$, $OCH_2Cl$, $OCHCl_2$, $OCCl_3$, chlorofluoromethoxy, dichlorofluoromethoxy, chlorodifluoromethoxy, 2-fluoroethoxy, 2-chloroethoxy, 2-bromoethoxy, 2-iodoethoxy, 2,2-difluoroethoxy, 2,2,2-trifluoroethoxy, 2-chloro-2-fluoroethoxy, 2-chloro-2,2-difluoroethoxy, 2,2-dichloro-2-fluoroethoxy, 2,2,2-trichloroethoxy, $OC_2F_5$, 2-fluoropropoxy, 3-fluoropropoxy, 2,2-difluoropropoxy, 2,3-difluoropropoxy, 2-chloropropoxy, 3-chloropropoxy, 2,3-dichloropropoxy, 2-bromopropoxy, 3-bromopropoxy, 3,3,3-trifluoropropoxy, 3,3,3-trichloropropoxy, $OCH_2-C_2F_5$, $OCF_2-C_2F_5$, 1-($CH_2F$)-2-fluoroethoxy, 1-($CH_2Cl$)-2-chloroethoxy, 1-($CH_2Br$)-2-bromoethoxy, 4-fluorobutoxy, 4-chlorobutoxy, 4-bromobutoxy or nonafluorobutoxy.

The term "$C_1$-$C_4$-alkylthio" is a $C_1$-$C_4$-alkyl group, as defined above, attached via a sulfur atom. $C_1$-$C_4$-Alkylthio is methylthio, ethylthio, n-propylthio, 1-methylethylthio (isopropylthio), n-butylthio, 1-methylpropylthio (sec-butylthio), 2-methylpropylthio (isobutylthio) or 1,1-dimethylethylthio (tert-butylthio).

The term "$C_1$-$C_4$-haloalkylthio" is a $C_1$-$C_4$-haloalkyl group, as defined above, attached via a sulfur atom. $C_1$-$C_4$-Haloalkylthio is, for example, $SCH_2F$, $SCHF_2$, $SCF_3$, $SCH_2Cl$, $SCHCl_2$, $SCCl_3$, chlorofluoromethylthio, dichlorofluoromethylthio, chlorodifluoromethylthio, 2-fluoroethylthio, 2-chloroethylthio, 2-bromoethylthio, 2-iodoethylthio, 2,2-difluoroethylthio, 2,2,2-trifluoroethylthio, 2-chloro-2-fluoroethylthio, 2-chloro-2,2-difluoroethylthio, 2,2-dichloro-2-fluoroethylthio, 2,2,2-trichloroethylthio, $SC_2F_5$, 2-fluoropropylthio, 3-fluoropropylthio, 2,2-difluoropropylthio, 2,3-difluoropropylthio, 2-chloropropylthio, 3-chloropropylthio, 2,3-dichloropropylthio, 2-bromopropylthio, 3-bromopropylthio, 3,3,3-trifluoropropylthio, 3,3,3-trichloropropylthio, $SCH_2-C_2F_5$, $SCF_2-C_2F_5$, 1-($CH_2F$)-2-fluoroethylthio, 1-($CH_2Cl$)-2-chloroethylthio, 1-($CH_2Br$)-2-bromoethylthio, 4-fluorobutylthio, 4-chlorobutylthio, 4-bromobutylthio or nonafluorobutylthio.

The term "$C_1$-$C_4$-alkylsulfonyl" is a $C_1$-$C_4$-alkyl group, as defined above, attached via a sulfonyl [$S(O)_2$] group. $C_1$-$C_4$-Alkylsulfonyl is methylsulfonyl, ethylsulfonyl, n-propylsulfonyl, 1-methylethylsulfonyl (isopropylsulfonyl), n-butylsulfonyl, 1-methylpropylsulfonyl (sec-butylsulfonyl), 2-methylpropylsulfonyl (isobutylsulfonyl) or 1,1-dimethylethylsulfonyl (tert-butylsulfonyl).

The term "$C_1$-$C_4$-haloalkylsulfonyl" is a $C_1$-$C_4$-haloalkyl group, as defined above, attached via a sulfonyl [$S(O)_2$] group. $C_1$-$C_4$-Haloalkylsulfonyl is, for example, $S(O)_2CH_2F$, $S(O)_2CHF_2$, $S(O)_2CF_3$, $S(O)_2CH_2Cl$, $S(O)_2CHCl_2$, $S(O)_2CCl_3$, chlorofluoromethylsulfonyl, dichlorofluoromethylsulfonyl, chlorodifluoromethylsulfonyl, 2-fluoroethylsulfonyl, 2-chloroethylsulfonyl, 2-bromoethylsulfonyl, 2-iodoethylsulfonyl, 2,2-difluoroethylsulfonyl, 2,2,2-trifluoroethylsulfonyl, 2-chloro-2-fluoroethylsulfonyl, 2-chloro-2,2-difluoroethylsulfonyl, 2,2-dichloro-2-fluoroethylsulfonyl, 2,2,2-trichloroethylsulfonyl, $S(O)_2C_2F_5$, 2-fluoropropylsulfonyl, 3-fluoropropylsulfonyl, 2,2-difluoropropylsulfonyl, 2,3-difluoropropylsulfonyl, 2-chloropropylsulfonyl, 3-chloropropylsulfonyl, 2,3-dichloropropylsulfonyl, 2-bromopropylsulfonyl, 3-bromopropylsulfonyl, 3,3,3-trifluoropropylsulfonyl, 3,3,3-trichloropropylsulfonyl, $S(O)_2CH_2$—$C_2F_5$, $S(O)_2CF_2$—$C_2F_5$, 1-($CH_2F$)-2-fluoroethylsulfonyl, 1-($CH_2Cl$)-2-chloroethylsulfonyl, 1-($CH_2Br$)-2-bromoethylsulfonyl, 4-fluorobutylsulfonyl, 4-chlorobutylsulfonyl, 4-bromobutylsulfonyl or nonafluorobutylsulfonyl.

Carboxyl is —C(O)OH.

The term "$C_1$-$C_4$-alkylcarbonyl" denotes a $C_1$-$C_4$-alkyl group, as defined above, attached via a carbonyl [C(=O)] group. Examples are acetyl (methylcarbonyl), propionyl (ethylcarbonyl), propylcarbonyl, isopropylcarbonyl, n-butylcarbonyl and the like.

The term "$C_1$-$C_4$-haloalkylcarbonyl" denotes a $C_1$-$C_4$-haloalkyl group, as defined above, attached via a carbonyl [C(=O)] group. Examples are trifluoromethylcarbonyl, 2,2,2-trifluoroethylcarbonyl and the like.

The term "$C_1$-$C_4$-alkoxycarbonyl" denotes a $C_1$-$C_4$-alkoxy group, as defined above, attached via a carbonyl [C(=O)] group. Examples are methoxycarbonyl), ethoxycarbonyl, propoxycarbonyl, isopropoxycarbonyl, n-butoxycarbonyl and the like.

The term "$C_1$-$C_4$-haloalkoxycarbonyl" denotes a $C_1$-$C_4$-haloalkoxy group, as defined above, attached via a carbonyl [C(=O)] group. Examples are trifluoromethoxycarbonyl, 2,2,2-trifluoroethoxycarbonyl and the like.

The term "$C_1$-$C_4$-alkylcarbonyloxy" denotes a $C_1$-$C_4$-alkyl group, as defined above, attached via a carbonyloxy [C(=O)O] group. Examples are acetyloxy (methylcarbonyloxy), propionyloxy (ethylcarbonyloxy), propylcarbonyloxy, isopropylcarbonyloxy, n-butylcarbonyloxy and the like.

The term "$C_1$-$C_4$-haloalkylcarbonyloxy" denotes a $C_1$-$C_4$-haloalkyl group, as defined above, attached via a carbonyloxy [C(=O)O] group. Examples are trifluoromethylcarbonyloxy, 2,2,2-trifluoroethylcarbonyloxy and the like.

The term "$C_1$-$C_4$-alkylamino" is a group —N(H)$C_1$-$C_4$-alkyl. Examples are methylamino, ethylamino, propylamino, isopropylamino, butylamino and the like.

The term "di-($C_1$-$C_4$-alkyl)amino" is a group —N($C_1$-$C_4$-alkyl)$_2$. Examples are dimethyl-amino, diethylamino, ethylmethylamino, dipropylamino, diisopropylamino, methylpropylamino, methylisopropylamino, ethylpropylamino, ethylisopropylamino, dibutylamino and the like.

The term "$C_1$-$C_4$-alkylaminocarbonyl" is a group —C(O)—N(H)$C_1$-$C_4$-alkyl. Examples are methylaminocarbonyl, ethylaminocarbonyl, propylaminocarbonyl, isopropylaminocarbonyl, butylaminocarbonyl and the like.

The term "di-($C_1$-$C_4$-alkyl)aminocarbonyl" is a group —C(O)—N($C_1$-$C_4$-alkyl)$_2$. Examples are dimethylaminocarbonyl, diethylaminocarbonyl, ethylmethylaminocarbonyl, dipropylaminocarbonyl, diisopropylaminocarbonyl, methylpropylaminocarbonyl, methylisopropylaminocarbonyl, ethylpropylaminocarbonyl, ethylisopropylaminocarbonyl, dibutylaminocarbonyl and the like.

$C_2$-$C_5$-Alkylene is a linear or branched divalent alkyl radical having 2, 3, 4 or 5 carbon atoms. Examples are —$CH_2CH_2$—, —$CH(CH_3)$—, —$CH_2CH_2CH_2$—, —$CH(CH_3)CH_2$—, —$CH_2CH(CH_3)$—, —$C(CH_3)_2$—, —$CH_2CH_2CH_2CH_2$—, —$CH(CH_3)CH_2CH_2$—, —$CH_2CH_2CH(CH_3)$—, —$C(CH_3)_2CH_2$—, —$CH_2C(CH_3)_2$—, —$CH_2CH_2CH_2CH_2CH_2$—, —$CH(CH_3)$—$CH_2$—$CH(CH_3)$— and —$CH_2$—$C(CH_3)_2$—$CH_2$—.

$C_2$-$C_6$-Alkylene is a linear or branched divalent alkyl radical having 2, 3, 4, 5 or 6 carbon atoms. Examples, in addition to the radicals stated above for $C_2$-$C_5$-alkylene, are —$CH_2CH_2CH_2CH_2CH_2CH_2$—.

$C_1$-$C_{10}$-Alkylene is a linear or branched divalent alkyl radical having 1, 2, 3, 4, 5, 6, 7, 8, 9 or 10 carbon atoms. Examples, in addition to the radicals stated above for $C_2$-$C_6$-alkylene, are methylene (—$CH_2$—), —$(CH_2)_n$— with n=7, 8, 9 or 10, and position isomers thereof.

Aryl is an aromatic carbocyclic ring. Examples are phenyl, naphthyl, phenanthrenyl and anthracenyl.

Aryl-$C_1$-$C_4$-alkyl is an aryl ring as defined above attached via a $C_1$-$C_4$-alkyl group as defined above. Examples are benzyl, 1-phenylethyl and phenethyl.

The composition containing semi-conducting single-walled carbon nanotubes generally contains at least one of the following carbonaceous materials: metallic single-walled carbon nanotubes, graphene, fullerenes, MWNTs, graphite, carbon black, amorphous carbon. Depending on the origin of the carbon source, the composition might also contain catalyst residues from the CNT production process which, of course, are to be unhitched as well. In particular, the composition containing semi-conducting single-walled carbon nanotubes also contains metallic single-walled carbon nanotubes, and optionally also graphene, fullerenes, MWNTs, graphite, carbon black and/or amorphous carbon.

Analogously, the composition containing metallic single-walled carbon nanotubes generally contains at least one of the following carbonaceous materials: semi-conducting single-walled carbon nanotubes, graphene, fullerenes, MWNTs, graphite, carbon black, amorphous carbon. Depending on the origin of the carbon source, the composition might also contain catalyst residues from the CNT production process which, of course, are to be unhitched as well. In particular, the composition containing metallic single-walled carbon nanotubes also contains semi-conducting single-walled carbon nanotubes, and optionally also graphene, fullerenes, MWNTs, graphite, carbon black and/or amorphous carbon.

In the method for separating semi-conducting and metallic single-walled carbon nanotubes from each other, the composition of course contains both semi-conducting and metallic single-walled carbon nanotubes and optionally also other carbonaceous materials such as graphene, fullerenes, MWNTs, graphite, carbon black and/or amorphous carbon, and possibly also catalyst residues from the CNT production process.

The composition containing semi-conducting and/or metallic single-walled carbon nanotubes can be obtained by any of the known methods for producing CNTs, such as arc discharge, laser ablation, high-pressure carbon monoxide disproportionation (also termed high pressure CO conversion; HiPCO), plasma torch, aerosol synthesis, chemical vapor deposition (CVD) and combinations thereof. Most of these processes take place in a vacuum or with process gases. CVD growth of CNTs can occur in vacuum or at atmospheric pressure. Specifically, the composition is obtained by HiPCO. CNTs can be produced in the presence of catalysts, most commonly nickel, cobalt, iron or a combination thereof. The catalyst is generally provided in the form of metal nanoparticles. The catalyst may also be supported on an inert catalyst carrier, such as alumina or silica.

Surface-active compounds are for example anionic, cationic, nonionic and amphoteric surfactants, block polymers, polyelectrolytes, and mixtures thereof. Examples of surfactants are listed in McCutcheon's, Vol. 1: Emulsifiers & Detergents, McCutcheon's Directories, Glen Rock, USA, 2008 (International Ed. or North American Ed.).

Suitable anionic surfactants are for example alkali, alkaline earth or ammonium salts of sulfonates, sulfates, phosphates, carboxylates, and mixtures thereof. Examples of sulfonates are alkylarylsulfonates, diphenylsulfonates, alpha-olefin sulfonates, lignine sulfonates, sulfonates of fatty acids and oils, sulfonates of ethoxylated alkylphenols, sulfonates of alkoxylated arylphenols, sulfonates of condensed naphthalenes, sulfonates of dodecyl- and tridecylbenzenes, sulfonates of naphthalenes and alkyl-naphthalenes, sulfosuccinates or sulfosuccinamates. Examples of sulfates are sulfates of fatty acids and oils, of ethoxylated alkylphenols, of alcohols, of ethoxylated alcohols, or of fatty acid esters. Examples of phosphates are phosphate esters. Examples of carboxylates are alkyl carboxylates, and carboxylated alcohol or alkylphenol ethoxylates.

Examples for nonionic surfactants are alkoxylates, N-substituted fatty acid amides, amine oxides, esters, sugar-based surfactants, polymeric surfactants, and mixtures thereof. Examples of alkoxylates are compounds such as alcohols, alkylphenols, amines, amides, arylphenols, fatty acids or fatty acid esters which have been alkoxylated with 1 to 50 equivalents. Ethylene oxide and/or propylene oxide may be employed for the alkoxylation, preferably ethylene oxide. Examples of N-substituted fatty acid amides are fatty acid glucamides or fatty acid alkanolamides. Examples of esters are fatty acid esters, glycerol esters or monoglycerides. Examples of sugar-based surfactants are sorbitans, ethoxylated sorbitans, sucrose and glucose esters or alkylpolyglucosides. Examples of polymeric surfactants are home- or copolymers of vinylpyrrolidone, vinylalcohols, or vinylacetate.

Examples for cationic surfactants are quaternary surfactants, for example quaternary ammonium compounds with one or two hydrophobic groups, or salts of long-chain primary amines. Suitable amphoteric surfactants are alkylbetains and imidazolines. Suitable block polymers are block polymers of the A-B or A-B-A type comprising blocks of polyethylene oxide and polypropylene oxide, or of the A-B-C type comprising alkanol, polyethylene oxide and polypropylene oxide. Suitable polyelectrolytes are polyacids or polybases. Examples of polyacids are alkali salts of polyacrylic acid or polyacid comb polymers. Examples of polybases are polyvinylamines or polyethyleneamines.

The surface-active compound to be used in the present invention is preferably selected from polyarylethers, polyarylsulfonates, poly(alkyleneoxide) blockcopolymers, condensation products of at least one arylsulfonic acid, at least one aldehyde and optionally at least one further compound different from arylsulfonic acids and aldehydes which is capable of undergoing condensation with the arylsulfonic acid(s) and/or the aldehyde(s); and salts thereof.

Polyarylether surface-active compounds suitable for the present invention preferably contain an aryl backbone formed by 2 or more, preferably 5 to 100, more preferably 5 to 20 aryl moieties (e.g. benzene rings) bound to each other via suitable linking groups, such as alkylene groups, e.g. $(CH_2)_n$ with n=1 to 4, $CH(CH_3)$, $C(CH_3)_2$, or $CH_2C(CH_3)_2$ $CH_2$; O, SO, $SO_2$ and the like. At least a part of the aryl groups carry one or more ether groups, e.g. derived from alkylene oxides, such as ethylene oxide (EO), propylene oxide (PO), tetrahydrofuran or pentylene oxide. These are introduced, for example, by using aryl groups carrying one or more hydroxyl groups, which are reacted with EO, PO, tetrahydrofuran, pentylene oxide and/or the like, or with other compounds suitable for ether formation, such as hydroxyalkyl halides, tosylates or triflates, and the like. The ether groups are either terminated with —OH or can be partially or completely functionalized at this terminal —OH group and thus be converted, for example, into a sulfate (—O—S(=O)$_2$OR with R=hydrogen, $C_1$-$C_4$-alkyl or optionally substituted phenyl), sulfonate (—O—S(=O)$_2$—R' with R'=$C_1$-$C_4$-alkyl or phenyl), phosphate (—O—P(=O)(OR)$_2$ with each R being independently H, $C_1$-$C_4$-alkyl or optionally substituted phenyl), phosphonate (—O—P(=O)(R')OR with each R being independently H, $C_1$-$C_4$-alkyl or optionally substituted phenyl and R' being $C_1$-$C_4$-alkyl or phenyl), carboxylate (—O—C(=O)—R' with R'=hydrogen, $C_1$-$C_4$-alkyl or phenyl), carbonate (O—C(=O)—OR with R=hydrogen, $C_1$-$C_4$-alkyl or optionally substituted phenyl) or other functional group. Those functional groups which contain an OH group (i.e. which contain a radical R and in which R is H) may be partially or fully neutralized; i.e. by reaction with a base a part or all of the OH groups may be converted into OM groups wherein M is a metal cation equivalent (i.e. $(M^{m+})_{1/m}$, where m is the valence of the metal cation) or an ammonium cation ($NR^aR^bR^cR^d)^+$, where $R^a$, $R^b$, $R^c$ and $R^d$, independently of each other, are hydrogen, $C_1$-$C_{10}$-alkyl or $C_1$-$C_{10}$-alkoxy (i.e. in this case R stands formally for a cation equivalent). The aryl groups may carry further radicals, for example radicals selected from alkyl, e.g. $C_1$-$C_{20}$-alkyl or long-chained alkyl groups derived from polyolefins with a number-average molecular weight of from 100 to 1000, e.g. alkyl groups derived from polyethylene, polypropylene, polybutylene and/or polyisobutylene; $C_1$-$C_4$-haloalkyl, halogen, hydroxyl, SH, $SO_3H$, $OSO_3H$, CN, $C_1$-$C_4$-alkoxy, $C_1$-$C_4$-haloalkoxy, $C_1$-$C_4$-alkylthio, $C_1$-$C_4$-haloalkylthio, $C_1$-$C_4$-alkylsulfonyl, $C_1$-$C_4$-haloalkylsulfonyl, amino, $C_1$-$C_4$-alkylamino, di($C_1$-$C_4$-alkyl)amino, carboxyl, $C_1$-$C_4$-alkylcarbonyl, $C_1$-$C_4$-haloalkylcarbonyl, $C_1$-$C_4$-alkoxycarbonyl, $C_1$-$C_4$-haloalkoxycarbonyl $C_1$-$C_4$-alkylcarbonyloxy, $C_1$-$C_4$-haloalkylcarbonyloxy, aminocarbonyl, $C_1$-$C_4$-alkylaminocarboyl, di($C_1$-$C_4$-alkyl)aminocarbonyl, and the like. Also optionally present aryl groups which do not carry an ether groups may carry one or more of the above-listed further substituents.

Preferably, the aryl groups in the polyarylether surface-active compounds are phenyl or naphthyl rings, in particular phenyl rings, which may be substituted as defined above. Preferably, at least 50%, in particular at least 80% of the aryl groups carry one or more, e.g. 1 or 2, preferably 1, ether substituent as defined above or in the following. The ether substituents are preferably of formula $+O-A+_x-Y$, wherein each A is independently selected from $C_2$-$C_5$-alkylene, each x is independently 1 to 100 and Y is selected from —OH, —O—S(=O)$_2$OR, —O—S(=O)$_2$—R', —O—P(=O)(OR)$_2$, —O—P(=O)(R')OR, —O—C(=O)—R' and —O—C(=O)—OR, where R and R' are as defined above. Preferably, A is selected from 1,2-ethylene and 1,2-propylene and is in particular 1,2-ethylene. Preferably, x is from 1 to 50. Preferably Y is selected from —OH, —O—S(=O)$_2$OR, —O—P(=O)(OR)$_2$ and —O—C(=O)—OR, where R is as defined above, and in particular from —OH and —O—P(=O)(OR)$_2$. Specifically, one part of the aryl rings carry ether substituents in which Y is —OH and another part of the aryl rings carry ether substituents in which Y is —O—P(=O)(OR)$_2$. R is preferably H. R' is preferably $C_1$-$C_4$-alkyl.

Preferably the linking groups between the aryl rings are alkylene groups, especially $CH_2$.

If the aryl groups or a part of the aryl groups carry further substituents, these are preferably selected from $C_1$-$C_2O$-alkyl, halogen, hydroxyl, $SO_3H$, $OSO_3H$, CN and $C_1$-$C_4$-alkoxy.

If present, aryl groups in the polyarylether surface-active compounds which do not carry an ether group as defined above are either unsubstituted (of course apart from their attachment points to the linking groups) or preferably carry 1, 2 or 3, preferably 1 or 2, of the above further substituents. Preferably, these substituents are selected from $C_1$-$C_{20}$-alkyl, halogen, hydroxyl, $SO_3H$, $OSO_3H$, CN and $C_1$-$C_4$-alkoxy, in particular from $C_1$-$C_2O$-alkyl, hydroxyl and 503H, and in particular from $C_4$-$C_{20}$-alkyl and hydroxyl.

Polyarylsulfonates as surface-active compounds suitable for the present invention preferably contain an aryl backbone formed by 2 or more, e.g. 5 to 100, aryl moieties (e.g. benzene or naphthalene rings) bound to each other via suitable linking groups, such as alkylene groups, e.g. $(CH_2)_n$ with n=1 to 4, $CH(CH_3)$, $C(CH_3)_2$, or $CH_2C(CH_3)_2CH_2$; O, SO, $SO_2$, C(=O), C(=O)O, OC(=O)O and the like. At least a part of the aryl groups carry one or more sulfonate groups —S(=O)$_2$OR, wherein R is selected from hydrogen, a cationic equivalent, $C_1$-$C_4$-alkyl and phenyl. The sulfonate groups might be bound directly to the aryl groups or via a linking group, such as a $C_1$-$C_{10}$-alkylene group or a polyether group $+$O-A$+_x$-, wherein A and x are as defined above. The sulfonic acid groups (i.e. the —S(=O)$_2$OR with R=H) may be partially or fully neutralized; i.e. by reaction with a base a part or all of the —S(=O)$_2$OH groups may be converted into —S(=O)$_2$OM groups wherein M is a metal cation equivalent (i.e. $(M^{m+})_{1/m}$, where m is the valence of the metal cation) or an ammonium cation $(NR^aR^bR^cR^d)^+$, where $R^a$, $R^b$, $R^c$ and $R^d$, independently of each other, are hydrogen, $C_1$-$C_{10}$-alkyl or $C_1$-$C_{10}$-alkoxy (i.e. in this case R stands formally for a cation equivalent). Suitable bases are for example $(M^{m+})(OH^-)_m$, $(M^{m+})(CO_3^-)_{m/2}$, ammonia, an amine $NR^aR^bR^c$, etc., e.g. LiOH, NaOH, KOH, $Na_2CO_3$, $K_2CO_3$, $NH_3$, triethylamine, Hünig's base etc. Preferred polyarylsulfonates are the Glydol® brands from Zschimmer & Schwarz, especially Glydol® N1055.

Poly(alkyleneoxide) blockcopolymers are diblock, triblock or tetrablock copolymers or copolymers with a higher block number containing blocks of at least two different polymerized alkyleneoxides. In order to have amphiphilic properties, they contain at least one polyethyleneoxide (PEO) block. The other block(s) is/are preferably selected from polypropyleneoxide (PPO), poly(1,2-pentyleneoxide) block(s) and the like, and is/are in particular polypropyleneoxide block(s). Preference is given to triblock and tetrablock copolymers with polyethyleneoxide and polypropyleneoxide blocks, and especially to the copolymers of the Pluronic® and Tetronic® brands of BASF. Pluronics® are poloxamers. Poloxamers are nonionic triblock copolymers composed of a central hydrophobic chain of polyoxypropylene (polypropylene oxide; PPO) flanked by two hydrophilic chains of polyoxyethylene (polyethylene oxide; PEO). Particularly, the Pluronics® contain 10 to 100, preferably 15 to 70, in particular 20 to 60 PO repeating units in the central PPO block and on each side 10 to 150, preferably 20 to 100 EO repeating units in each PEO block. Tetronics® are X-shaped copolymers with four PPO-PEO blocks bonded to a central ethylene diamine linker.

In the condensation products of at least one arylsulfonic acid, at least one aldehyde and optionally at least one further compound different from arylsulfonic acids and aldehydes which is capable of undergoing condensation with the arylsulfonic acid(s) and/or the aldehyde(s) the arylsulfonic acid is preferably selected from naphthylsulfonic acid, phenylsulfonic acid and phenolsulfonic acid and in particular from 1- and especially 2-naphthylsulfonic acid and phenolsulfonic acid.

Suitable aldehydes are for example formaldehyde, acetaldehyde, propionaldehyde or butyraldehyde. The aldehyde is preferably formaldehyde.

The further compound different from arylsulfonic acids and aldehydes is preferably selected from urea, urea derivatives, amines having at least two primary and/or secondary amino groups, melamine, melamine derivatives and hydroxyaromatic compounds, such as phenol, resorcinol, hydroquinone, catechol or the naphtholes.

The urea derivatives of components are for example
substituted ureas of formula $R^1R^2N$—C(=O)—$NR^3R^4$, in which $R^1$, $R^2$, $R^3$, and $R^4$ independently of one another are selected from hydrogen, $C_1$-$C_{10}$-alkyl, aryl, and aryl-$C_1$-$C_4$-alkyl, with at least one of the radicals $R^1$, $R^2$, $R^3$, and $R^4$ not being hydrogen;
or $R^1$ and $R^2$ and/or $R^3$ and $R^4$ each together are $C_2$-$C_5$-alkylene, with one methylene group (i.e., a $CH_2$ group in the alkylene chain) optionally being replaced by a carbonyl group;
or $R^1$ and $R^3$ together are $C_2$-$C_5$-alkylene, with one methylene group (i.e., a $CH_2$ group in the alkylene chain) optionally being replaced by a carbonyl group;
or $R^1$ and $R^2$ and/or $R^3$ and $R^4$, in each case together with the nitrogen atom to which they are attached, form a 5- or 6-membered unsaturated aromatic or nonaromatic ring which may comprise one or two further nitrogen atoms or a sulfur atom or oxygen atom as ring member (i.e., $R^1$ and $R^2$, and/or $R^3$ and $R^4$, together with the nitrogen atom to which they are attached, stand for a 5- or 6-membered unsaturated aromatic or nonaromatic ring which is attached via N and may comprise one or two further nitrogen atoms or one sulfur atom or oxygen atom as ring member);
biuret
thiourea;
substituted thioureas of formula $R^5R^6N$—C(=S)—$NR^7R^8$, in which $R^5$, $R^6$, $R^7$, and $R^8$ independently of one another are selected from hydrogen, $C_1$-$C_{10}$-alkyl, aryl, and aryl-$C_1$-$C_4$-alkyl, with at least one of the radicals $R^5$, $R^6$, $R^7$, and $R^8$ not being hydrogen;
or $R^5$ and $R^6$ and/or $R^7$ and $R^8$ each together are $C_2$-$C_5$-alkylene, with one methylene group (i.e., a $CH_2$ group in the alkylene chain) optionally being replaced by a carbonyl group;
or $R^5$ and $R^7$ together are $C_2$-$C_5$-alkylene, with one methylene group (i.e., a $CH_2$ group in the alkylene chain) optionally being replaced by a carbonyl group;
or $R^5$ and $R^6$ and/or $R^7$ and $R^8$, in each case together with the nitrogen atom to which they are attached, form a 5- or 6-membered unsaturated aromatic or nonaromatic ring which may comprise one or two further nitrogen atoms or a sulfur atom or oxygen atom as ring member (i.e., $R^5$ and $R^6$, and/or $R^7$ and $R^8$, together with the nitrogen atom to which they are attached, stand for a 5- or 6-membered unsaturated aromatic or non-aromatic ring which is attached via N and may comprise one or two further nitrogen atoms or one sulfur atom or oxygen atom as ring member);

guanidine;

substituted guanidines of the formula $R^9R^{10}N-C(=NR^{11})-NR^{12}R^{13}$, in which $R^9$, $R^{10}$, $R^{11}$, $R^{12}$, and $R^{13}$ independently of one another are selected from hydrogen, $C_1$-$C_{10}$-alkyl, aryl, and aryl-$C_1$-$C_4$-alkyl, with at least one of the radicals $R^9$, $R^{10}$, $R^{11}$, $R^{12}$, and $R^{13}$ not being hydrogen; or $R^9$ and $R^{10}$ and/or $R^{12}$ and $R^{13}$ each together are $C_2$-$C_5$-alkylene, with one methylene group (i.e., a $CH_2$ group in the alkylene chain), optionally being replaced by a carbonyl group; or $R^9$ and $R^{12}$ together are $C_2$-$C_5$-alkylene, with one methylene group (i.e. a $CH_2$ group in the alkylene chain), optionally being replaced by a carbonyl group; or $R^9$ and $R^{10}$ and/or $R^{12}$ and $R^{13}$, in each case together with the nitrogen atom to which they are attached, form a 5- or 6-membered unsaturated aromatic or nonaromatic ring which may further comprise one further nitrogen atom, sulfur atom or oxygen atom as ring member (i.e., $R^9$ and $R^{10}$, and/or $R^{12}$ and $R^{13}$, together with the nitrogen atom to which they are attached, stand for a 5- or 6-membered unsaturated aromatic or nonaromatic ring which is attached via N and may comprise one or two further nitrogen atoms or one sulfur atom or oxygen atom as ring member); or carbonic esters of the formula $R^{14}$—O—CO—O—$R^{15}$, in which $R^{14}$ and $R^{15}$ independently of one another are selected from $C_1$-$C_{10}$-alkyl, aryl, and aryl-$C_1$-$C_4$-alkyl, or $R^{14}$ and $R^{15}$ together are $C_2$-$C_5$-alkylene.

Amines having at least two primary and/or secondary amino groups are for example amines of the formula

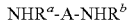
NHR$^a$-A-NHR$^b$ in which

A is a divalent aliphatic, alicyclic, aliphatic-alicyclic, aromatic or araliphatic radical, with the aforementioned radicals also possibly being interrupted by a carbonyl group or by a sulfone group and/or possibly substituted by 1, 2, 3 or 4 radicals selected from $C_1$-$C_4$-alkyl; or is a divalent radical of the formula

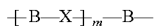
$+B-X+_m-B-$ in which each X is independently O or NR$^c$, in which R$^c$ is H, $C_1$-$C_4$-alkyl, $C_2$-$C_4$-hydroxyalkyl or $C_1$-$C_4$-alkoxy, and preferably is H, $C_1$-$C_4$-alkyl or $C_1$-$C_4$-alkoxy; each B independently of one another is $C_2$-$C_6$-alkylene; and m is a number from 1 to 100; preferably 1 to 80, and more particularly 1 to 20; and R$^a$ and R$^b$ independently of one another are H, $C_1$-$C_4$-alkyl, $C_2$-$C_4$-hydroxyalkyl or $C_1$-$C_4$-alkoxy, and preferably are H, $C_1$-$C_4$-alkyl or $C_1$-$C_4$-alkoxy, such as 1,2-ethylenediamine, 1,2- and 1,3-propylenediamine, 2,2-dimethyl-1,3-propanediamine, 1,4-butylenediamine, 1,5-pentylenediamine, hexamethylenediamine, heptamethylenediamine, octamethylenediamine, nonamethylenediamine, decamethylenediamine, 2,2,4- or 2,4,4-trimethyl-1,6-hexamethylenediamine, 1,5-diamino-2-methylpentane, 1,4-diamino-4-methylpentan, 1,2-diaminocyclopentane, 1,3-diaminocyclopentane, 1,2-diaminocyclohexane, 1,3-diaminocyclohexane, 1,4-diaminocyclohexane, 1-methyl-2,4-diaminocyclohexane, 1-methyl-2,6-diaminocyclohexane, diaminodicyclohexylmethane, isophoronediamine, 1,1-bis(aminomethyl)cyclohexane, 1,2-bis(aminomethyl)cyclohexane, 1,3-bis(aminomethyl)cyclohexane, 1,4-bis(aminomethyl)cyclohexane, 2-aminopropylcyclohexylamine, 3(4)-aminomethyl-1-methylcyclohexylamine, o-, m-, and p-phenylenediamine, o-, m-, and p-tolylenediamine, xylylenediamine, 1,2-, 1,3-1,4-, 1,5-, 1,8-, 2,3-, 2,6-, and 2,7-naphthylene, 2,2'-, 3,3'-, and 4,4'-diaminodiphenyl sulfone, 2,2'-, 3,3'-, and 4,4'-diaminobenzophenone, and 2,2'-, 3,3'-, and 4,4'-diaminodi-phenylmethane, amine-terminated polyoxyalkylene polyols, examples being Jeffamines, such as 4,9-dioxadodecane-1,12-diamine and 4,7,10-trioxatridecane-1,13-diamine, or else more regular amine-terminated polyoxyalkylene polyols, such as amine-terminated polyethylene glycols, amine-terminated polypropylene glycols or amine-terminated polybutylene glycols, diethylenetriamine, triethylenetetramine, tetraethylenepentamine, pentaethylenehexamine, hexaethyleneheptamine, heptaethyleneoctamine, octaethylenenonamine, higher polyimines, bis(3-aminopropyl)amine, or bis(3-aminopropyl)methylamine.

Melamine derivatives are for example benzoguanamine, substituted melamines, and melamine condensates, such as melam, melem, melon, and higher condensates. Melam (empirical formula $C_6$—$H_9N_{11}$) is a dimeric condensation product of 2,4-diamino-6-chloro-s-triazine with melamine. Melem (empirical formula $C_6H_6N_{10}$) is the tri-amino-substituted tri-s-triazine (1,3,4,6,7,9,9b-heptaazaphenalene). Melon (empirical formula $C_6H_3N_9$) is likewise a heptazine.

The further compound different from arylsulfonic acids and aldehydes is in particular selected from urea and phenol.

The condensation products of at least one arylsulfonic acid, at least one aldehyde and optionally at least one further compound different from arylsulfonic acids and aldehydes which is capable of undergoing condensation with the arylsulfonic acid(s) and/or the aldehyde(s) the arylsulfonic acid is in particular is a condensation product of naphthylsulfonic acid and formaldehyde, such as the Tamol® N brands from BASF, or a condensation product of phenolsulfonic acid, formaldehyde, urea and phenol, such as the Tamol® DN or PP brands from BASF.

In the above condensation products the sulfonic acid groups may be partially or fully neutralized; i.e. by reaction with a base a part or all of the —S($=$O)$_2$OH groups may be converted into —S($=$O)$_2$OM groups wherein M is a metal cation equivalent (i.e. $(M^{m+})_{1/m}$, where m is the valence of the metal cation) or an ammonium cation $(NR^aR^bR^cR^d)^+$, where $R^a$, $R^b$, $R^c$ and $R^d$, independently of each other, are hydrogen, $C_1$-$C_{10}$-alkyl or $C_1$-$C_{10}$-alkoxy (i.e. in this case R stands formally for a cation equivalent). Suitable bases are for example $(M^{m+})(OH^-)_m$, $(M^{m+})(CO_3^-)_{m/2}$, ammonia, an amine NR$^a$R$^b$R$^c$, etc., e.g. LiOH, NaOH, KOH, $Na_2CO_3$, $K_2CO_3$, $NH_3$, triethylamine, Hünig's base etc.

In case that semi-conducting single-walled carbon nanotubes are to be obtained, the surface-active compound is preferably selected from polyarylethers containing phosphate groups —O—P($=$O)(OR)$_2$ and/or phosphonate groups —O—P($=$O)(R')OR, where each R is independently selected from hydrogen, a cationic equivalent, $C_1$-$C_4$-alkyl and optionally substituted phenyl and R' is selected from $C_1$-$C_4$-alkyl and phenyl; and containing preferably phosphate groups —O—P(=O)(OR)$_2$.

If R is a cationic equivalent, the group —OR is group —OM wherein M is a metal cation equivalent (i.e. $(M^{m+})_{1/m}$, where m is the valence of the metal cation) or an ammonium cation $(NR^aR^bR^cR^d)^+$, where $R^a$, $R^b$, $R^c$ and $R^d$, independently of each other, are hydrogen, $C_1$-$C_{10}$-alkyl or $C_1$-$C_{10}$-alkoxy. Such groups —OM are generally obtained by partially or fully neutralizing polyarylethers containing one or more OH groups (i.e. containing a radical R and in which R is H); i.e. by reacting them with a base, such as $(M^{m+})(OH^-)_m$, $(M^{m+})(CO_3^-)_{m/2}$, ammonia, an amine $NR^aR^bR^c$, etc., e.g. LiOH, NaOH, KOH, Na$_2$CO$_3$, K$_2$CO$_3$, NH$_3$, triethylamine, Hühig's base etc., so that a part or all of the OH groups are converted into OM groups.

More preferably, the surface-active compound is selected from polyarylethers having a backbone formed by 2 or more, preferably 5 to 100, more preferably 5 to 50 aryl moieties selected from phenyl and naphthyl rings bound to each other via linking groups selected from $C_1$-$C_5$-alkylene groups, preferably methylene (CH$_2$), where at least a part of the aryl groups, preferably at least 50%, in particular at least 80% of the aryl groups, carry one or more, preferably 1 or 2, in particular 1, ether groups of formula —[O-A]$_x$—Y, wherein each A is independently selected from $C_2$-$C_5$-alkylene, each x is independently 1 to 50, in a part of the ether groups Y is OH, in a part of the ether groups Y is —O—P(=O)(OR)$_2$, and, optionally, in a part of the ether groups Y may be selected from —O—S(=O)$_2$OR, —O—S(=O)$_2$—R', —O—P(=O)(R')OR, —O—C(=O)—R' and —O—C(=O)—OR, where each R is independently selected from hydrogen, $C_1$-$C_4$-alkyl and optionally substituted phenyl and each R' is independently selected from $C_1$-$C_4$-alkyl and phenyl, and where R can also stand for a cationic equivalent; and where preferably A is selected from 1,2-ethylene and 1,2-propylene, in particular 1,2-ethylene, Y is selected from —OH and —O—P(=O)(OR)$_2$, where one part of the aryl rings carry ether groups in which Y is —OH and another part of the aryl rings carry ether groups in which Y is —O—P(=O)(OR)$_2$, and where x is 5 to 50, preferably 10 to 40 if Y is OH, and x is 1 if Y is —O—P(=O)(OR)$_2$.

R is preferably H. R' is preferably $C_1$-$C_4$-alkyl.

If the aryl groups or a part of the aryl groups carry further substituents, these are preferably selected from $C_1$-$C_{20}$-alkyl, halogen, hydroxyl, SO$_3$H, OSO$_3$H, CN and $C_1$-$C_4$-alkoxy.

If present, aryl groups in the polyarylether surface-active compounds which do not carry an ether group as defined above are either unsubstituted (of course apart from their attachment points to the linking groups) or preferably carry 1, 2 or 3, preferably 1 or 2, of the above further substituents. Preferably, these substituents are selected from $C_1$-$C_{20}$-alkyl, halogen, hydroxyl, SO$_3$H, OSO$_3$H, CN and $C_1$-$C_4$-alkoxy, in particular from $C_1$-$C_{20}$-alkyl, hydroxyl and SO$_3$H, and in particular from $C_4$-$C_{20}$-alkyl and hydroxyl.

Preferably, the polyarylether is obtainable by the condensation of
(1) at least one monohydroxyaromatic derivative in which the hydroxyl group is etherified with a $C_2$-$C_5$-alkyl group which carries a phosphate group —O—P(=O)(OR)$_2$, with each R being independently H, a cationic equivalent (definition see above), $C_1$-$C_4$-alkyl or optionally substituted phenyl;
(2) at least one monohydroxyaromatic derivative in which the hydroxyl group is etherified by reaction with at least one diol precursor selected from ethylene oxide, propylene oxide, tetrahydrofuran and 1,2-pentylene oxide;
(3) at least one monohydroxyaromatic compound carrying one or more $C_4$-$C_{20}$-alkyl groups, preferably carrying one or more $C_{10}$-$C_{20}$-alkyl groups; and
(4) an aldehyde source;
and if desired partial or complete neutralization of the obtained product.

"Monohydroxyaromatic compound" refers to an aromatic compound carrying only one hydroxyl group (and optionally other substituents different from OH). The "monohydroxyaromatic derivative" in (1) and (2) is derived from such a monohydroxyaromatic compound. The monohydroxyaromatic compound in (3) or from which (1) and (2) derive is for example a hydroxybenzene or a hydroxynaphthaline, preferably a hydroxybenzene, where the phenyl or naphthyl ring, apart from the hydroxyl group (and the mandatory $C_{10}$-$C_{20}$-alkyl group(s) in (3)), may carry 1 or 2 further substituents such as $C_1$-$C_4$-alkyl, $C_1$-$C_4$-haloalkyl, cyano, $C_1$-$C_4$-alkoxy, $C_1$-$C_4$-haloalkoxy, and the like. Preferably, the phenyl or naphthyl rings do not carry any further substituents.

In (1) the $C_2$-$C_5$-alkyl group is preferably a $C_2$-$C_3$-alkyl group, more preferably a $C_2$-alkyl group.

In (2) the diol precursor is preferably selected from ethylene oxide and propylene oxide and is in particular ethylene oxide. The compound (2) contains preferably from 5 to 50, in particular from 10 to 40 repeating units of the diol precursor; i.e. is obtained by reacting 1 mole of hydroxyaromatic compound with 5 to 50, preferably 10 to 40 moles of diol precursor.

In (3) the monohydroxyaromatic compound carries preferably just one $C_{10}$-$C_{20}$-alkyl group. The alkyl group is preferably a $C_{10}$-$C_{16}$-alkyl group, and especially a $C_{12}$-alkyl group.

Suitable aldehydes (4) are for example formaldehyde, acetaldehyde, propionaldehyde or butyraldehyde or compounds from which these aldehydes are accessible (called aldehyde sources). Examples for formaldehyde sources are gaseous formaldehyde, formalin solutions, formaldehyde oligomers, such as trioxane or tetraoxane, and formaldehyde polymers, such as paraformaldehyde. Preference is given to formaldehyde, which, for practical reasons, is preferably used in form of trioxane or paraformaldehyde.

In particular, the polyarylether is obtainable by the condensation of
(1) at least one monohydroxyaromatic derivative obtainable by the reaction (esterification) of phenoxyethanol and phosphoric acid or polyphosphoric acid;
(2) at least one monohydroxyaromatic derivative obtainable by the reaction [(poly)addition reaction] of phenol and ethylene oxide, preferably with 5 to 50, in particular 10 to 40 moles of ethylene oxide per mole of phenol;
(3) dodecylphenol; and
(4) a formaldehyde source;
and if desired partial or complete neutralization of the obtained product.

Preferably, the at least one monohydroxyaromatic derivative (1) is used in molar excess to the overall amount of (2) and (3), preferably in an amount of from 1.1 to 20 mol per mol of (2)+(3), in particular 1.5 to 10 mol per mol of (2)+(3), especially 2 to 5 mol per mol of (2)+(3).

(2) and (3) are preferably used in a molar ratio of from 10:1 to 1:10, more preferably 5:1 to 1:5 and in particular from 2:1 to 1:2.

The aldehyde (4) is used in a sufficiently high amount to allow coupling of compounds (1), (2) and (3).

The condensation reaction is generally carried out in the presence of a catalyst. Suitable catalysts for such condensation reactions are known and are for example protic acids, such as sulfuric acid, phosphoric acid, sulfonic acids, such as methane sulfonic acid, trifluoromethane sulfonic acid or toluenesulfonic acid, and carboxylic acids, such as trifluoroacetic acid; or Lewis acids, such as aluminum trihalides, e.g. aluminum trichloride or tribromide, boron trihalides, such as boron trifluoride or trichloride, or iron(III) halides, such as ferric chloride or bromide. Among these, preference is given to protic acids, especially to the above sulfonic acids.

The condensation reaction is generally carried out at elevated temperature, e.g. at from 60 to 180° C., preferably from 100 to 150° C.

If desired, after completion of the condensation the product can be neutralized, e.g. by addition of a base, e.g. of aqueous NaOH, KOH, $Na_2CO_3$ or the like.

The polyarylether has preferably a number average molecular weight $M_n$ of from 1000 to 50000, more preferably from 3000 to 30000 and in particular from 5000 to 20000.

The polyarylether has preferably a dispersity ($M_w/M_n$; $M_w$ being the weight average molecular weight) of from 1 to 10, in particular from 1 to 5 and specifically from 1.1 to 2.

The invention also relates to the polyarylether obtainable by the above-described condensation reaction, and to its use as a surface-active compound, especially as a surface-active compound in the method of the invention.

In case that preferentially metallic single-walled carbon nanotubes are to be obtained, the surface-active compound is preferably selected from the above-described polyarylsulfonates, poly(alkyleneoxide) blockcopolymers and condensation products of at least one arylsulfonic acid, at least one aldehyde and optionally other compounds. Among these, the polyarylsulfonates and the condensation products are preferred. Reference is made to the above-described preferred embodiments of the polyarylsulfonates, the poly(alkyleneoxide) blockcopolymers and the condensation products of at least one arylsulfonic acid, at least one aldehyde and optionally other compounds.

The polytungstate is preferably one analogous to SPT (i.e. $M_6[H_2W_{12}O_{40}]$, wherein M is a cation equivalent), wherein the counter cation (equivalent) is not restricted to sodium, but can be any counter cation, provided that the corresponding polytungstate is soluble in aqueous media. Suitable counter cations are metal cation equivalents, i.e. $(M^{m+})_{1/m}$, wherein M is a metal and m is the valence of the metal; and ammonium cations $(NR^aR^bR^cR^d)+$, where $R^a$, $R^b$, $R^c$ and $R^d$, independently of each other, are hydrogen, $C_1$-$C_{10}$-alkyl or $C_1$-$C_{10}$-alkoxy. Preferred metal cation equivalents are alkali metal cations, such as $Li^+$, $Na^+$ or $K^+$, and alkaline earth metal cation equivalents, such as $(Mg^{2+})_{1/2}$ or $Ca^2)_{1/2}$; alkali metal cations being preferred. Aqueous media/solutions are defined below. Preferably, the cation equivalent is selected from $Li^+$ (the polytungstate thus being lithium polytungstate), $Na^+$ (the polytungstate thus being sodium polytungstate), $K^+$ (the polytungstate thus being potassium polytungstate) or $NH_4^+$ (the polytungstate thus being ammonium polytungstate). In particular, however, the polytungstate is sodium polytungstate (SPT).

The solution of the polytungstate is preferably aqueous. This means that the solvent is either water or a mixture of water and at least one water-miscible organic solvent. Suitable organic solvents are for example lower alkanols, such as methanol, ethanol, propanol or isopropanol, polyols, such as ethylene glycol, propylene glycol, diethylene glycol or triethylene glycol, cyclic ethers, such as tetrahydrofuran, 1,3- or 1,4-dioxane, amides, such as dimethylformamide, and dimethylsulfoxide. Among these, preference is given to the above alkanols. If the aqueous solution contains at least one water-soluble organic solvent, this is preferably present in an overall amount of at most 50% by weight, preferably at most 20% by weight and in particular at most 10% by weight, based on the total weight of water plus organic solvent. Preferably, the liquid solution contains water as solvent, and no organic solvent.

The solution of the polytungstate preferably contains at least one surface-active compound. Preferred surface-active compounds are those mentioned above which are brought into contact with the composition containing semi-conducting and/or metallic single-walled carbon nanotubes and (optionally) undesired carbonaceous material. Preferably, the surface-active compounds brought into contact with the composition containing semi-conducting and/or metallic single-walled carbon nanotubes and (optionally) undesired carbonaceous material and the surface-active compounds contained in the solution of the polytungstate are the same.

Preferably, the solution of the polytungstate preferably contains at least one surface-active compound in an amount of from 0.05 to 5% by weight, more preferably from 1 to 5% by weight, and in particular from 1 to 3% by weight, based on the total weight of the solution of the polytungstate.

For obtaining preferentially semi-conducting single-walled carbon nanotubes, preferably, the solution of the polytungstate has at least one zone with a density which corresponds to the density of a complex formed by semi-conducting single-walled carbon nanotubes and the at least one surface-active compound. This is generally in the range of from 1.05 to 1.30 $g/cm^3$, specifically from 1.1 to 1.2 $g/cm^3$. Accordingly, the solution of the polytungstate has preferably at least one zone with a density of from 1.05 to 1.3 $g/cm^3$, specifically of from 1.1 to 1.2 $g/cm^3$.

Similarly, for obtaining preferentially metallic single-walled carbon nanotubes, preferably, the solution of the polytungstate has at least one zone with a density which corresponds to the density of a complex formed by metallic single-walled carbon nanotubes and the at least one surface-active compound. This is generally in the range of from 1.05 to 1.30 $g/cm^3$, specifically from 1.1 to 1.2 $g/cm^3$. Accordingly, the solution of the polytungstate has preferably at least one zone with a density of from 1.05 to 1.3 $g/cm^3$, specifically of from 1.1 to 1.2 $g/cm^3$.

It has been found that the role of the polytungstate is not limited to that of a density medium. In fact, one aspect of the separation effect of the polytungstate is its pH in solution. Aqueous polytungstate solutions are acidic, the exact pH depending, of course, on the respective concentration (the higher the concentration, the lower the pH). It has been observed that even when using a single layer of polytungstate with a single density (i.e. not a density gradient; the density being in the range of the isopycnic point of the complex formed by semi-conducting or metallic SWNTs; i.e. from 1.05 to 1.3 $g/cm^3$), semi-conducting and metallic SWNTs are nevertheless separated. Depending on the surface-active compounds used, either the metallic SWNTs (as well as other undesired carbonaceous material) or the semi-conducting SWNTs (as well as other undesired carbonaceous material) precipitate. Without wishing to be bound by theory, it is assumed that acidic polytungstate solutions affect the complex formed by metallic SWNTs (and other carbonaceous material) and surfactant(s) if these are those preferably used for obtaining semi-conducting SWNTs (e.g. the above-described polyarylethers), while the complex formed by semi-conducting SWNTs and surfactant(s) stays essentially unaffected. As a consequence, "naked" metallic SWNTs and/or the altered complex with surfactants and further undesired carbonaceous material, which have significantly higher densities than the complex formed by semi-conducting SWNTs and surfactant(s), precipitate, and this even without applying any density gradient centrifugation. Vice versa, when using as surfactant those preferably used for obtaining metallic SWNTs (e.g. the above-described poly(alkyleneoxide) blockcopolymers or the condensation products of at least one arylsulfonic acid, at least one aldehyde and optionally other compounds), acidic polytungstate solutions affect the complex formed by semi-conducting SWNTs (and other carbonaceous material) and surfactant(s), while the complex formed by metallic SWNTs and surfactant(s) stays essentially unaffected. As a consequence, "naked" semi-condicting SWNTs and/or the altered complex with surfactants and further undesired carbonaceous material, which have significantly higher densities than the complex formed by metallic SWNTs and surfactant(s), precipitate, and this even without applying any density gradient centrifugation.

This assumption is confirmed when the pH of the polytungstate/surface-active compound solution (the surface-active compound is mentioned here just to make clear that this, too, can be acidic or basic and thus can influence the pH) is adjusted to at least 5 or better at least 6 or even better at least 7. In this case, no precipitation of metallic or semi-conducting SWNTs is observed. However, semi-conducting and metallic SWNTs can still be separated at this higher pH by applying "classical" density gradient centrifugation; the polytungstate acting in this case just as a density medium. Thus, using a density gradient of the polytungstate/surface-active compound solution at a pH of at least 5 or better at least 6 or even better at least 7 allows the separation of semiconducting and metallic SWNTs from each other as well as from other carbonaceous material, if present.

Thus, preferably, in case that the solution of the polytungstate/surface-active compound has at least one zone with a pH of below 5, preferably of at most 4, in particular of at most 3 (and of course with the proviso that the pH is not neutralized by the composition containing the material to be separated) the density separation step is selected from centrifugation, filtration, especially pressure filtration, and sedimentation; and in particular from centrifugation; and in case that the solution of the polytungstate/surface-active compound has a pH of at least 5, preferably at least 6, more preferably at least 7, the density separation step is selected from density gradient centrifugation. More preferably, in case that the solution of the polytungstate has at least one zone with a pH of at most 3, in particular of at most 2.5, the density separation step is selected from centrifugation, filtration, especially pressure filtration, and sedimentation; and in particular from centrifugation; and in case that the solution of the polytungstate has a pH of at least 6, preferably at least 7, and, for example at most 14 or at most 12, the density separation step is selected from density gradient centrifugation.

In filtration, the density separation medium, i.e. the polytungstate solution, works like a liquid filter medium. Filtration is preferably carried out under pressure, similarly to flash chromatography. For practical reasons, i.e. for enabling the polytungstate solution to work like a liquid filter medium, the solution is preferably thickened, e.g. with a gelling agent (also known as thickening agent or thickener), such as natural thickeners, e.g. agar, carragreen, gum tragacanth, gum arabic, alginates, pectinates, polyoses, guar flour, locust bean flour, starch, dextrins, gelatins or casein; modified natural substances, e.g. cellulose ethers, such as carboxymethylcellulose, furthermore hydroxyethyl- and hydroxypropylcellulose and the like, or synthetic thickeners, e.g. polyacrylic acids and/or polyacrylates with a number-average molecular weight of $1 \times 10^3$ to $1 \times 10^9$, homo- or copolymers of acrylamide and/or methacrylamide with a number-average molecular weight of $1 \times 10^3$ to $1 \times 10^9$ and ethylene/maleic anhydride copolymers with a number-average molecular weight of $1 \times 10^3$ to $1 \times 10^9$.

Sedimentation can for example be carried out by contacting the composition containing the material to be separated and the solution of the polytungstate with a pH of below 5, preferably below 4, in particular below 3, and letting sediments form. Contacting can be carried out by mixing the composition containing the material to be separated and the solution of the polytungstate or by superposing the composition containing the material to be separated on the solution of the polytungstate.

In both pH scenarios (i.e. pH of the solution of the polytungstate below 5 versus pH of at least 5), it is not necessary to carry out centrifugation as ultracentrifugation; lower rotational velocities are also sufficient. Ultracentrifugation is of course nevertheless a suitable method.

Preferably, centrifugation is carried out with a mean acceleration of from 100 to 300000×g, preferably of from 2000 to 50000×g, in particular of from 5000 to 15000×g.

The centrifugation time depends on various factors, such as acceleration, the components in the composition from which the semi-conducting SWCNTs are to be separated, the pH of the polytungstate solution etc. and may vary in wide ranges, such as from 0.5 to 30 h or 5 to 25 h or 10 to 20 h. The optimum time can be readily determined by preliminary tests. If the pH of the polytungstate solution is below 2, rather shorter centrifugation times are expedient because the polytungstate, especially SPT, may be prone to some degradation at very low pH values.

If centrifugation is used as the density separation step, preferably one or more layers of a solution of the polytungstate are placed in a centrifugation tube. If two or more layers are used, these are placed on top each other. In case that two or more layers are used, the layers have different densities, so that they can form a density gradient, and are preferably placed in order of decreasing densities, the layer with the highest density being at the bottom of the centrifugation tube and the layer with the lowest density being at the top of the centrifugation tube. In case that the solution of the polytungstate has or is to have a pH of at least 5, two or more layers are used. Preferably, 1, 2, 3, 4 or 5 layers, in particular 1, 2, 3 or 4 layers, of a solution of a polytungstate are used, with the proviso that in case that the solution of the polytungstate has or is to have a pH of at least 5, 2, 3, 4 or 5, in particular 2, 3 or 4, layers are used.

If only one layer of the polytungstate solution is used, this has a density of preferably from 1.05 to 1.3 g/cm$^3$, specifically from 1.1 to 1.2 g/cm$^3$.

If two or more layers are used, one of these layers has a density of preferably from 1.05 to 1.3 g/cm$^3$, specifically from 1.1 to 1.2 g/cm$^3$. Suitably, this layer in not the bottom layer, but the top or one of the middle layers.

Preferably, if two or more layers of the solution of the polytungstate are used, the densities of the bottom layer and the top layer differ by at least 0.1 g/cm$^3$, preferably by at least 0.2 g/cm$^3$ and in particular by at least 0.5 g/cm$^3$, e.g. by at least 0.7 g/cm$^3$; the bottom layer suitably having the highest density and the top layer the lowest.

In order to obtain higher diversification of the desired semi-conducting SWNTs, i.e. to obtain separation into different subgroups of semi-conducting SWNTs or metallic SWNTs, preferably a solution of the polytungstate with a pH of at most 4, preferably of at most 3, in particular at most 2.5, e.g. from 1.5 to 4 or from 1.5 to 3 or from 1.8 to 2.5, is used as separation medium, and the applied separation method is density gradient centrifugation, using at least 2, e.g. 2 to 5, preferably at least 3, e.g. 3 to 5, layers of different density. Alternatively, a solution of the polytungstate with a pH of at most 4, preferably of at most 3, in particular of at most 2.5, e.g. from 1.8 to 4 or from 1.8 to 3 or from 1.8 to 2.5, is used as separation medium, and the applied separation method is centrifugation, using at least 1 layer, e.g. 1 or 2 layers. The fraction enriched in semi-conducting SWCNTs is isolated and subjected to a density gradient centrifugation using at least 2, e.g. 2 to 5, preferably at least 3, e.g. 3 to 5, layers of different density. The densities in the different layers are suitably in the range of from 1.05 to 1.3 g/cm$^3$, preferably 1.1 to 1.2 g/cm$^3$; the differences between the layers being subtle.

The same applies for obtaining higher diversification of desired metallic SWNTs.

The methods of the invention are preferably carried out as follows, comprising following steps:
(i) dispersing a composition containing semi-conducting and/or metallic single-walled carbon nanotubes and optionally other carbonaceous material, in a liquid medium, preferably an aqueous medium, containing at least one surface-active compound to obtain a dispersion;
(ii) providing a solution of a polytungstate;
(iii) placing the dispersion obtained in step (i) on or into the solution provided in step (ii);
(iv) submitting the composition obtained in step (iii) to a density separation step;
(v-1) separating the fraction or fractions enriched in semi-conducting single-walled carbon nanotubes from the fraction or fractions enriched in other carbonaceous material; in particular from the fraction or fractions enriched in metallic single-walled carbon nanotubes and from the fraction or fractions containing other carbonaceous material, if present; or
(v-2) separating the fraction or fractions enriched in metallic single-walled carbon nanotubes from the fraction or fractions enriched in other carbonaceous material; in particular from the fraction or fractions enriched in semi-conducting single-walled carbon nanotubes and from the fraction or fractions containing other carbonaceous material, if present; and
(vi) if desired repeating steps (i) to (iv) with one or more of the fractions obtained in step (v).

The above remarks to preferred embodiments of the different aspects of the methods of the invention, such as to the composition containing semi-conducting and/or metallic SWCNTs, to the surface-active compound, to the polytungstate and the polytungstate solution, to specific forms of the density separation step etc. apply here, too.

The liquid medium of step (i) is preferably aqueous, i.e. either water or a mixture of water and at least one water-soluble organic solvent. Suitable organic solvents are for example lower alkanols, such as methanol, ethanol, propanol or isopropanol, polyols, such as ethylene glycol, propylene glycol, diethylene glycol or triethylene glycol, cyclic ethers, such as tetrahydrofuran, 1,3- or 1,4-dioxane, amides, such as dimethylformamide and N-methylpyrrolidone, lower ketones, such as acetone and ethylmethylketone, and dimethylsulfoxide. Among these, preference is given to the above alkanols.

If the aqueous medium contains at least one water-soluble organic solvent, this is preferably present in an overall amount of at most 50% by weight, preferably at most 20% by weight and in particular at most 10% by weight, based on the total weight of water plus organic solvent.

Preferably, the liquid medium contains only water as solvent, and no organic solvent.

In step (i) the composition containing semi-conducting and/or metallic single-walled carbon nanotubes, calculated as solid carbon matter, is preferably used in an amount of from 0.01 to 2% by weight, in particular from 0.1 to 1% by weight, based on the total weight of the dispersion; i.e. the dispersion obtained in step (i) contains the composition containing semi-conducting and/or metallic single-walled carbon nanotubes, calculated as solid carbon matter, in an amount of from 0.01 to 2% by weight, in particular from 0.1 to 1% by weight, based on the total weight of the dispersion.

The at least one surface-active compound is used in step (i) in an amount of from 0.05 to 5% by weight, more preferably of from 1 to 5% by weight, in particular of from 1 to 3% by weight, based on the total weight of the dispersion; i.e. the dispersion obtained in step (i) contains the at least one surface-active compound in an amount of from 0.05 to 5% by weight, in particular from 1 to 5% by weight, based on the total weight of the dispersion.

Dispersion of the composition containing semi-conducting and/or metallic single-walled carbon nanotubes and (optionally) other carbonaceous material can be carried out by any means which ensures a fine and even distribution of the material in the dispersion, such as ultrasonic treatment (ultrasonic horn, ultrasonic bath, tip sonication and the like) or effective mechanical stirring or agitation, e.g. with an Ultra-Turrax® (from IKA®-Werke GmbH & Co. KG, Germany) or a Dispermat® (from Getzmann, Germany). Both pulsed or continuous treatments may be applied. Ultrasonic treatment is preferred.

Preferably, step (i) comprises providing a mixture containing semi-conducting and/or metallic single-walled carbon nanotubes and (optionally) other carbonaceous material, water and at least one surface-active compound and subjecting the mixture to an ultrasonic treatment.

If the density separation step (iv) is to be centrifugation, in step (ii) preferably one or more layers of a solution of the polytungstate are placed in a centrifugation tube. If the density separation step (iv) is to be density gradient centrifugation, preferably two or more layers of a solution of the polytungstate are placed on top each other. In the latter case, i.e. in case that two or more layers are used, the layers have different densities and are preferably placed in order of decreasing densities, the layer with the highest density being at the bottom of the centrifugation tube and the layer with the lowest density being at the top of the centrifugation tube. The densities of the bottom layer and the top layer differ preferably by at least 0.1 g/cm$^3$, more preferably by at least 0.2 g/cm$^3$ and in particular by at least 0.5 g/cm$^3$, e.g. by at least 0.7 g/cm$^3$.

In step (iii) the dispersion obtained in step (i) is placed on or into the solution provided in step (ii). This is done by usual means, such as overlaying the solution of step (ii) with the dispersion of step (i), e.g. with a (micro)pipette or a (micro)syringe or the like. If the dispersion of step (i) is placed "into" the solution provided in step (ii), this is usually done by first overlaying at least a part of the solution of step (ii) with the dispersion of step (i) and then overlaying the latter with the remainder of the solution of step (ii) or just with water optionally containing surface-active compounds or with the solvent used for preparing the solution of step (ii). If the density separation step is sedimentation, placing the dispersion of step (i) "into" the solution provided in step (ii) can be carried out by simply mixing dispersion and solution.

In step (v-1) the fraction or fractions enriched in semi-conducting single-walled carbon nanotubes is/are separated from the fraction or fractions enriched in other carbonaceous material. Convenient measures depend on the density separation step (iv) applied. For instance, density gradient centrifugation usually yields visible bands having a different optical aspect which can be separated by carefully removing the single layers, e.g. with a (micro)pipette or (micro)syringe or a piston gradient fractionator or another suitable means. This process can also be automatized. The same applies to step (v-2). If centrifugation is carried out at a pH of below 5, preferably below 4, in particular below 3 and the surface-active compound is the one preferably used for obtaining semi-conducting single-walled carbon nanotubes, generally the fraction enriched in semi-conducting single-walled carbon nanotubes is found in the region with a density of from 1.05 to 1.3 $g/cm^3$, while the other carbonaceous materials are found at the bottom of the centrifugation tube. This makes separation of the fraction enriched in semi-conducting single-walled carbon nanotubes much easier than in the density gradient ultracentrifugation methods of the prior art. Similarly in step (v-2): If the centrifugation is carried out at a pH of below 5, preferably below 4, in particular below 3 and the surface-active compound is the one preferably used for obtaining metallic single-walled carbon nanotubes, generally the fraction enriched in metallic single-walled carbon nanotubes is found in the region with a density of from 1.05 to 1.3 $g/cm^3$, while the other carbonaceous materials are found at the bottom of the centrifugation tube. This makes separation of the fraction enriched in metallic single-walled carbon nanotubes much easier than in the density gradient ultracentrifugation methods of the prior art.

If desired the fraction(s) enriched in semi-conducting single-walled carbon nanotubes obtained in step (v-1) or other fractions can be resubmitted to steps (i) to (iv) in order to enhance purity and/or yield of the desired material, especially the semi-conducting SWCNTs.

For this purpose the fraction(s) to be resubmitted to steps (i) to (iv) are preferably first freed from solvent, polytungstate and surfactant. For instance, the fraction(s) containing the semi-conducting SWCNTs are diluted with water and centrifuged. The semi-conducting SWCNTs concentrate at the bottom in solid form. Thus the supernatant is discarded, the solid is washed with water which optionally contains surfactant and redispersed in analogy to step (i). All or selected steps may be repeated multiple times.

These steps can also be carried out to purify and isolate the desired semi-conducting SWCNTs without reintroducing them into steps (i) to (iv).

Analogously, the fraction(s) enriched in metallic single-walled carbon nanotubes obtained in step (v-2) or other fractions can be resubmitted to steps (i) to (iv) in order to enhance purity and/or yield of the desired material, especially the metallic SWCNTs. For this purpose the fraction(s) to be resubmitted to steps (i) to (iv) are preferably first freed from solvent, polytungstate and surfactant. For instance, the fraction(s) containing the metallic SWCNTs are diluted with water and centrifuged. The metallic SWCNTs concentrate at the bottom in solid form. Thus the supernatant is discarded, the solid is washed with water which optionally contains surfactant and redispersed in analogy to step (i). These steps can also be carried out to purify and isolate the desired metallic SWCNTs without reintroducing them into steps (i) to (iv).

The polytungstate removed from the process may be purified and reused.

The whole process can also be carried out in a semi-continuous or continuous manner.

The invention further relates to the use of a polytungstate, in particular of sodium polytungstate, for separating semi-conducting single-walled carbon nanotubes from metallic single-walled carbon nanotubes. The invention also relates to the use of a polytungstate, in particular of sodium polytungstate, for separating semi-conducting single-walled carbon nanotubes from undesired carbonaceous material, in particular from metallic single-walled carbon nanotubes. The invention also relates to the use of a polytungstate, in particular of sodium polytungstate, for separating metallic single-walled carbon nanotubes from undesired carbonaceous material, in particular from semi-conducting single-walled carbon nanotubes. The above explanations and preferred embodiments apply here, too. Preferably, the polytungstate is used in combination with at least one surface-active compound. Suitable and preferred surface-active compounds are listed above.

Moreover, the invention relates to semi-conducting single-walled carbon nanotubes, obtainable by the method of the invention. The semi-conducting single-walled carbon nanotubes of the invention have a particularly high purity. Preferably they have a purity of at least 99% by weight, more preferably of at least 99.1% by weight, in particular of at least 99.1% by weight. Preferably they contain less than 1% by weight, more preferably less than 0.9% by weight and in particular less than 0.8% by weight of metallic single-walled carbon nanotubes.

The invention also relates to the use of semi-conducting single-walled carbon nanotubes of the invention in electronic devices, optical devices, optoelectronic devices or energy storage devices; in particular in transistors, especially FETs and TFTs (for example for the use in back planes), memory devices, sensors, photodetectors, or solar cells.

The semi-conducting single-walled carbon nanotubes of the invention are in particular used in transistors; in particular in field-effect transistors (FETs), especially in FETs made from individual CNTs (see Park, H. et al.; Nature Nanotechnology 2012, 7, 787-791) and in FETs made from CNT networks (Lau, P. H. et al.; Nano Lett. 2013, 13, 3864-3869). To these, great potential for development is ascribed, for example in organic electronic devices such as back planes for display devices as well as storage elements and integrated optoelectronic devices. A further important application is in optical devices; especially in light-emitting diodes. Organic light-emitting diodes (OLEDs) are especially of interest as an alternative to cathode ray tubes and liquid-crystal displays for producing flat visual display units. Owing to the very compact design and the intrinsically low power consumption, devices which comprise OLEDs are suitable especially for mobile applications, for example for applications in cell phones, laptops, etc. The semi-conducting single-walled carbon nanotubes of the invention are furthermore suitable for the use in memory devices, sensors (e. g. chemical sensors, temperature sensors, pressure sensors), photodetectors, solar cells and thin-film transistors (TFTs). The semi-conducting single-walled carbon nanotubes of the invention may be applied for example via spin-coating, slot-die coating, screen printing, inkjet printing, flexographic printing, gravure printing, doctor blading, spray coating, drawdown-bar coating, aerosol deposition and the like. It is also possible to place the semi-conducting single-walled carbon nanotubes of the invention on specific positions on a functionalized substrate via ion-exchange techniques as described in Park, H. et al.; Nature Nanotechnology 2012, 7, 787-791. By this approach, arrays of individually positioned semi-conducting single-walled carbon nanotubes can be obtained.

Field-effect transistors generally comprise a substrate having at least one gate structure, a source electrode and a drain electrode as well as an insulating layer and at least one semiconductor material; in the present case semiconducting SWCNTs.

The semi-conducting SWCNTs can be in principle used as n-type semiconductors or as p-type semiconductors. Whether they act as n-type semiconductor or as p-type semiconductors depends inter alia on the employed transistor (contact materials, surface) and the measuring conditions (vacuum, air).

The semi-conducting SWCNTs of the invention may be used, for example, for the production of integrated circuits (ICs), for which customary n-channel MOSFETs (metal oxide semiconductor field-effect transistors) have been used to date. These are then CMOS-like semiconductor units, for example for microprocessors, microcontrollers, static RAM and other digital logic circuits. They are especially suitable for use in displays (specifically large-surface area and/or flexible displays), RFID tags, smart labels and sensors.

The optical device is for example an electroluminescent arrangement. Electroluminescent arrangements generally comprise an upper electrode, a lower electrode, wherein at least one of said electrodes is transparent, an electroluminescent layer and optionally an auxiliary layer, wherein the electroluminescent arrangement comprises at least one semiconductor material; in the present case semi-conducting SWCNTs. Preferably the electroluminescent arrangement is in form of an organic light-emitting diode (OLED).

Moreover, the invention relates to metallic single-walled carbon nanotubes, obtainable by the method of the invention. The metallic single-walled carbon nanotubes of the invention have a particularly high purity. Preferably they have a purity of at least 99% by weight, more preferably of at least 99.1% by weight, in particular of at least 99.1% by weight. Preferably they contain less than 1% by weight, more preferably less than 0.9% by weight and in particular less than 0.8% by weight of semi-conducting single-walled carbon nanotubes.

The invention also relates to the use of metallic single-walled carbon nanotubes of the invention as or in electric conductors, e.g. in form of transparent conductive layers, touch screens, RFID antennas, interconnect devices, sensors (e. g. chemical sensors, temperature sensors, pressure sensors), photodetectors, solar cells, battery devices, capacitor devices, catalysts and the like.

The use of polytungstate solutions, in particular of sodium polytungstate solutions, as separation medium allows a much simpler, less tedious and less energy- and time-consuming separation of semi-conducting and/or metallic single-walled carbon nanotubes than the prior art methods using DGU, especially DGU with sugar-based gradients. The use of polytungstate not only redundantizes the preparation of sophisticated density gradients, which requires long centrifugation times even before the actual separation can start, but also makes ultracentrifugation superfluous. The versatility of polytungstate separation media allows different approaches to different separation problems, such as separating selectively only one type of SWNTs, e.g. only the semi-conductive, or only the metallic, or preparing differentiated density gradients and thus separating selectively the various SWNT chiralities or more differentiated subgroups thereof.

The invention is now further illustrated by the following figures and examples.

FIGURES

FIG. 1 shows the UV/Vis/NIR spectrum of the bluish layer obtained in example 2.1 (continuous line). As can be seen, the band between 400 and 550 nm belonging to metallic SWCNTs has disappeared; cf. with spectrum of raw material containing dispersion of CNT starting material in water containing 2% by weight of PAE1, based on the total weight of the dispersion (dotted line).

FIG. 2 compares the UV/Vis/NIR spectrum of the two bluish bands obtained in example 2.2 (continuous line) and the spectrum of the reddish band obtained in example 2.2 (dotted line).

FIG. 3 compares the UV/Vis/NIR spectrum of the sheet formed in the top part of the centrifugation tubes of example 2.3 (dotted line) with the spectrum of the bluish layer obtained in example 2.1 (continuous line). As can be seen, in both spectra, the band between 400 and 550 nm belonging to metallic SWCNTs has disappeared.

FIG. 4 shows the UV/Vis/NIR spectrum of the bluish layer obtained in example 2.5 (dotted line). As can be seen, the band between 400 and 550 nm belonging to metallic SWCNTs has disappeared; cf. with spectrum of raw material containing dispersion of CNT starting material in water containing 2% by weight of PAE1, based on the total weight of the dispersion (continuous line).

EXAMPLES

Figure 1:
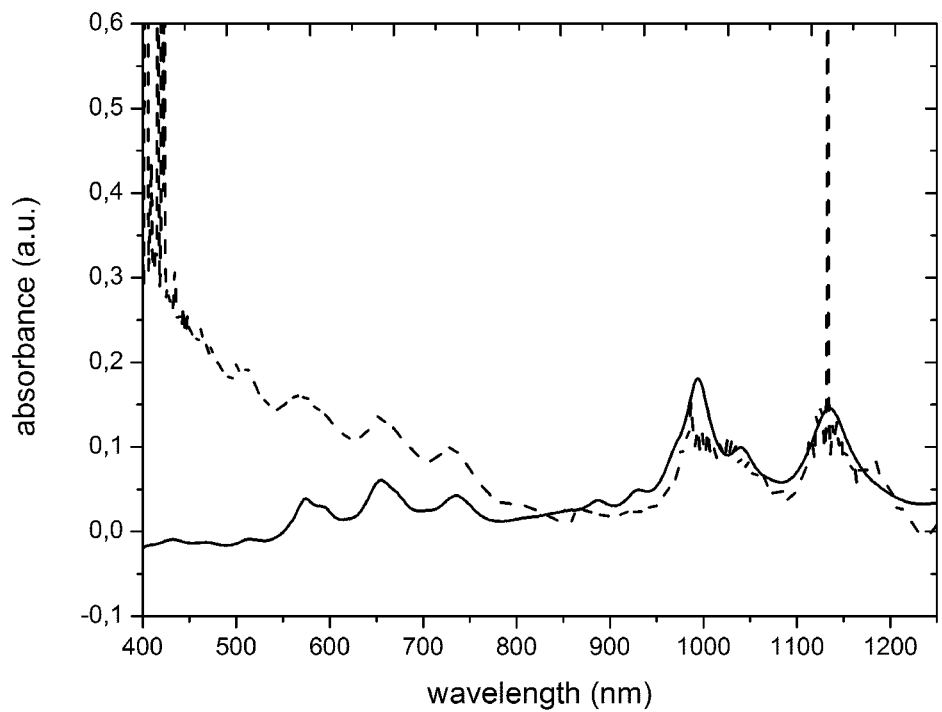

1. Preparation of Polyarylether Surfactants PAE1 and PAE2

A reactor, equipped with heating and stirrer was charged with 127 g of polyphosphoric acid (specified to have 85% $P_2O_5$ content). The content was heated to 60-100° C. 1 mol of phenoxyethanol was added to the stirred reaction mixture through a period of 1 to 3 hours. After the addition was finished, the reaction mix was stirred for an additional hour. The reaction product contained 75%-wt. of phenoxyethanol phosphoric acid monoester (ester of 1 mol of phenoxyethanol with 1 mol of phosphoric acid), 5%-wt. of bis(phenoxyethanol)phosphoric acid ester (ester of 2 mols phenoxyethanol with 1 mol of phosphoric acid), 1%-wt. of unreacted phenoxyethanol and 19%-wt. of unreacted phosphoric acid.

The reaction product of the phosphorylation was used without further purification as starting material for the following polycondensation step.

General Polycondensation Procedure:

A corrosion-resistant reactor equipped with a stirrer and temperature control was charged with the starting materials listed in table 1 in the given order:

1. poly(ethyleneoxide)monophenylether (Ph-PEG), 2. phosphorylated phenoxyethanol (PPE), 3. dodecylphenol, 4. paraformaldehyde or trioxan, 5. methansulfonic acid 98%. Upon completion of the addition of the acid, the reaction mix was heated to 115-120° C. After 3 hours the polycondensation reaction was finished and water was added. The polycondensate PAE2 (only this) was neutralized with NaOH to pH 6-8. Finally the solid content of the product was adjusted with water to 30-35%.

TABLE 1

| Product | Ph-PEG $M_w$ [D] | PPE[1] [g] | Dodecylphenol [g] | Trioxan [g] | Paraformaldehyde [g] | $CH_3SO_3H$ 98% [g] | $M_w^2$ Reaction product [D] |
|---|---|---|---|---|---|---|---|
| PAE 1 | 750 | 37.51 | 54.55 | 13.51 | 9.03 | 0 | 2.92 | 6981 |
| PAE 2 | 1500 | 60.7 | 87.20 | 20.40 | 0 | 16.33 | 2.39 | 12587 |

[1]contains 75%-wt. of phenoxyethanol phosphoric acid monoester, 5%-wt. of bis(phenoxyethanol)phosphoric acid ester, 1%-wt. of phenoxyethanol and 19%-wt. of phosphoric acid.
[2]The molecular weights of the polymers were determined by using gel permeation chromatography method (GPC) as described below:
Column combination: OH-Pak SB-G, OH-Pak SB 804 HQ and OH-Pak SB 802.5 HQ by Shodex, Japan; eluent: 80 Vol.-% aqueous solution of HCO2NH4 (0.05 mol/l) and
20 Vol.-% acetonitrile; injection volume 100 µl; flow rate 0.5 ml/min. The molecular weight calibration was performed with poly(styrene sulphonate) standards for the UV detector and poly(ethylene oxide) standards for the RI detector. Both standards were purchased from PSS Polymer Standards Service, Germany. In order to determine the molecular weight of the polymers, result based on UV-detection (254 nm) was used, because the UV detector is only responsive towards the aromatic compounds and neglects inorganic impurities, that otherwise could falsify the results for the molecular weights. The dispersity was in each case 1.3.

2. Separation Examples

The starting carbon nanotube material was a HiPCO (high pressure CO conversion) material from NanoIntegris (SWNTs-Raw batch no. R1-912).

Example 2.1

The CNT raw material was dispersed in deionized water containing PAE1 from example 1 as surface-active compound under permanent tip sonication (Dr. Hielscher Up 200 s; tip: S2; amplitude: 195 µm, depth of immersion: ca. 2 cm) for 1 h under ice cooling. The obtained dispersion contained 0.5% by weight of the CNT raw material and 2% by weight of PAE, based on the total weight of the dispersion.

Four solutions containing sodium polytungstate (SPT) in different concentrations (see table 2 below) and 2% by weight of PAE1, based on the overall weight of the solution, and thus having different densities were prepared:

TABLE 2

| SPT concentration [% by weight] | pH of solution | Density of solution [g/cm³] |
|---|---|---|
| 21 | 2.4 | 1.20 |
| 34 | 2.4 | 1.37 |
| 43 | 2.3 | 1.51 |
| 64 | 2.3 | 2.04 |

The different SPT solutions were placed in centrifugation tubes of ca. 6 cm×1 cm (6 ml) in layers of between 0.5 and 1.6 ml on top of each other in order of decreasing density (0.5 ml of 64% SPT solution, 1.2 ml of 43% SPT solution, 1.6 ml of 34% SPT solution and 0.7 ml of 21% SPT solution), and on top of the SPT layers were injected 0.5 ml of the CNT dispersion. Centrifugation was carried out in a Beckmann Ultima-XL Ultracentrifuge for 18 h at 10,000×g.

After centrifugation the tubes were first analyzed visually. All tubes showed a bluish layer in the top zone of the tubes, a middle zone without any specific color (the color of the SPT solution) and a dark layer at the bottom of the tubes.

The top, bluish layer, the middle layer and the bottom dark layer were extracted separately from the tubes. For analysis the extracted bluish fraction had to be freed of the remaining SPT content, which absorbs light, thus interfering with the nanotube transitions, and also inhibits transistor measurements by being an insulator once dried. To remove the SPT, the bluish fraction (ca 0.5 ml) was loaded onto a centrifugation tube. The tube was then filled with 4 ml of deionized water. A centrifugation run was performed at 250.000×g for 4 h to force the nanotubes towards the bottom of the centrifuge tube. After the run, the supernatant was extracted using a pipette. About 0.1 ml of liquid phase and the nanotubes that agglomerated on the bottom of the tube were left. The centrifugation tube was again filled with water, ensuring that the nanotubes were re-dispersed and also the remaining SPT was mixed over the whole tube volume. These steps were repeated with 4 centrifugation steps in total. Then the tube was refilled to a volume of 0.5 ml with water containing 2% of sodium cholate hydrate (a well-known surfactant for nanotube dispersion). A total of 6 centrifugation tubes were used, all with the same parameters. The contents of the 6 tubes were transferred to a vial and tip-sonicated for 15 minutes to re-disperse the nanotubes.

Analytics of the Blue Fraction/UV-Vis-NIR:

The characterization of SWCNTs according to their electronic behavior (i.e. semi-conducting and metallic species) was carried out by recording the absorbance spectra of individualized SWCNTs with a UV/Vis/NIR spectrometer (PerkinElmer UV/Vis/NIR Spectrometer 750). The accessible range of wavelength reaches from 200-3000 nm and is therefore able to cover the characteristic absorption peaks of individualized HiPco SWCNTs (400-1400 nm). All samples were background-corrected to a reference sample, which was measured at the same time and contained 2% of sodium cholate hydrate, the surfactant used, in water. All spectra of the listed experiments are shown in FIG. 1.

To record the spectra of the sample and the reference they were filled in a 0.5 ml cuvette and placed in the beamline of the spectrometer. The measuring range was set to 200 nm to 1400 nm to cover all transitions of the nanotubes.

As FIG. 1 shows, essentially no metallic SWNTs are present (these have typical absorption bands at 400-550 nm). Thus, the bluish layer contains virtually only semi-conducting SWNTs.

In sum, the bluish layer was identified to contain the separated semi-conducting SWCNTs in a purity of 99.2%. The dark bottom layer, in a density region of ca. 2 g/cm$^3$, was identified to contain the remaining CNT material, including the metallic SWCNTs. The middle layer was essentially devoid of any CNT material.

Example 2.2

In order to prove that the bluish layer of example 2.1 consists indeed essentially of semi-conducting SWNTs, this was freed from SPT and the surfactant and re-dispersed in a 2% sodium cholate hydrate solution as described in example 2.1 and then subjected to a "standard" density gradient ultracentrifugation using a Nycodenz® gradient (50%/40%/27.5%/22.5% by weight of Nyodenz in H$_2$O) containing 2% sodium cholate hydrate at pH 7; see table 3.

TABLE 3

| Nycodenz concentration [% by weight] | pH of solution | Density of solution [g/cm$^3$] |
| --- | --- | --- |
| 22.5 | 7 | 1.14 |
| 27.5 | 7 | 1.18 |
| 40 | 7 | 1.27 |
| 50 | 7 | 1.35 |

Centrifugation was carried out at 25,000×g for 18 h. Centrifugation resulted in 2 bluish bands, which were analyzed with UV/Vis/NIR.

The same treatment was applied to the bottom layer of example 2.1. Centrifugation resulted in multiple bands of which a reddish one was the largest. This reddish band was isolated and analyzed with UV/Vis/NIR.

Figure 2:
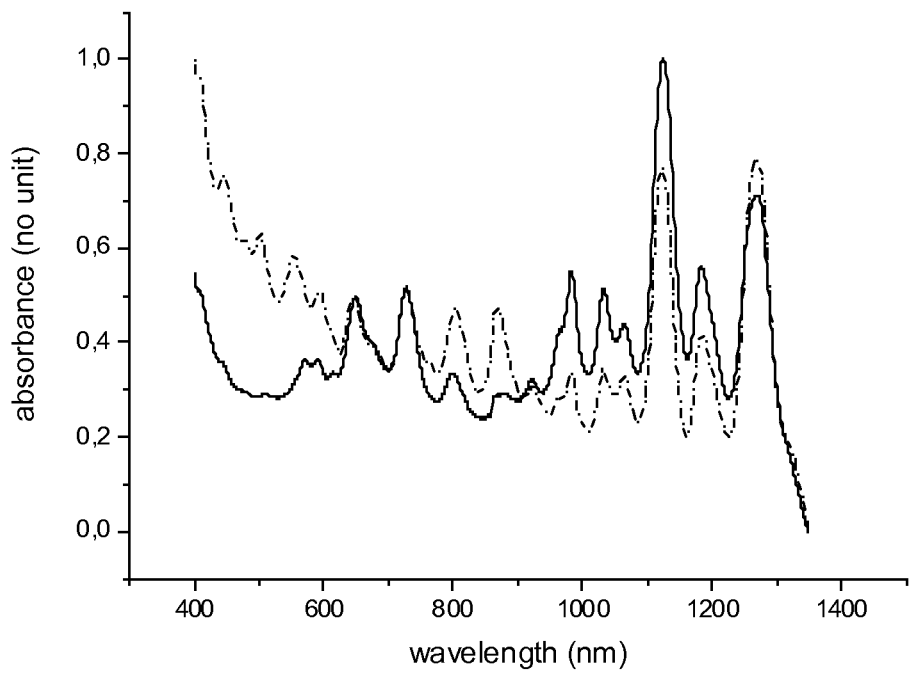

As FIG. 2 shows, the spectrum of the two bluish bands corresponds essentially to the spectrum of the bluish layer of example 2.1. Thus, indeed the bluish layer of example 2.1 consists essentially of semi-conducting SWNTs. The spectrum of the reddish band, by contrast, shows absorption bands in the range of 400-550 nm, which means that the reddish band (and therefore a substantial fraction of the bottom layer of example 2.1) mainly consists of metallic SWNTs (plus other carbonaceous material). This proves that the simplified separation method of example 2.1 results in a top layer consisting essentially of semi-conducting SWNTs which is essentially devoid of metallic SWNTs, while the latter concentrate in the bottom layer.

Example 2.3

The separation was carried out in analogy to example 2.1, applying however 72 h of centrifugation, using larger centrifugation tubes of up to 30 ml, using only two layers of SPT (6 ml of 64% by weight SPT solution; 9 ml of 43% by weight of SPT solution), and using 15 ml of the SWNT dispersion. In this case, in addition to the bluish layer formed in the top region of the centrifugation tube, a dark, free-standing sheet of SWNTs formed on the surface of the tube.

Figure 3:
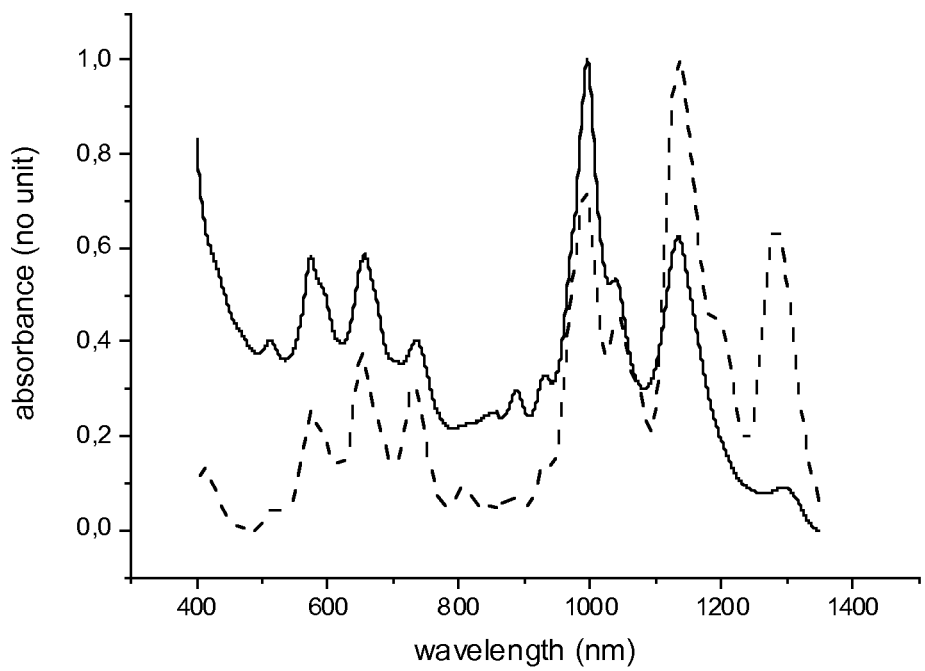

For analysis, smaller parts of the sheets were placed in 150 ml of deionized water in a vial and extracted only after a few days to get rid of remaining SPT. Each part was then stored in 10 ml of deionized water for further analysis. Data was then collected from one part of the sheet. The sheet was carefully extracted with a pipette from its 10 ml water bath and then placed on a quartz glass, which itself was placed on a hot plate, but still freely floating in approximately 1 ml of water. The sheet was then manually unfolded and carefully smoothed. The hot plate was heated to 90° C., thus removing the water and leaving the sheet flat on the surface of the quartz. The sheet was then subjected to a UV/Vis/NIR analysis. The reference (blank quartz) was manually subtracted from the spectrum. The spectrum is shown in FIG. 3; this reveals that the sheet is composed of semi-conducting SWNTs.

Moreover, Raman spectra were recorded, which clearly confirmed that the sheet is composed of semi-conducting SWNTs Example 2.4

The separation was carried out in analogy to example 2.1, however the layer containing 43% SPT was omitted and the SPT/PAE1 solutions were neutralized with aqueous NaOH to pH 7 before they were loaded to the centrifugation tubes. Centrifugation resulted in multiple bands at the place one would expect SWCNTs sorted with respect to their density, analogously to prior art separations using Nycodenz gradients. The topmost layer was bluish; the layer below orange.

Example 2.5

Figure 4:
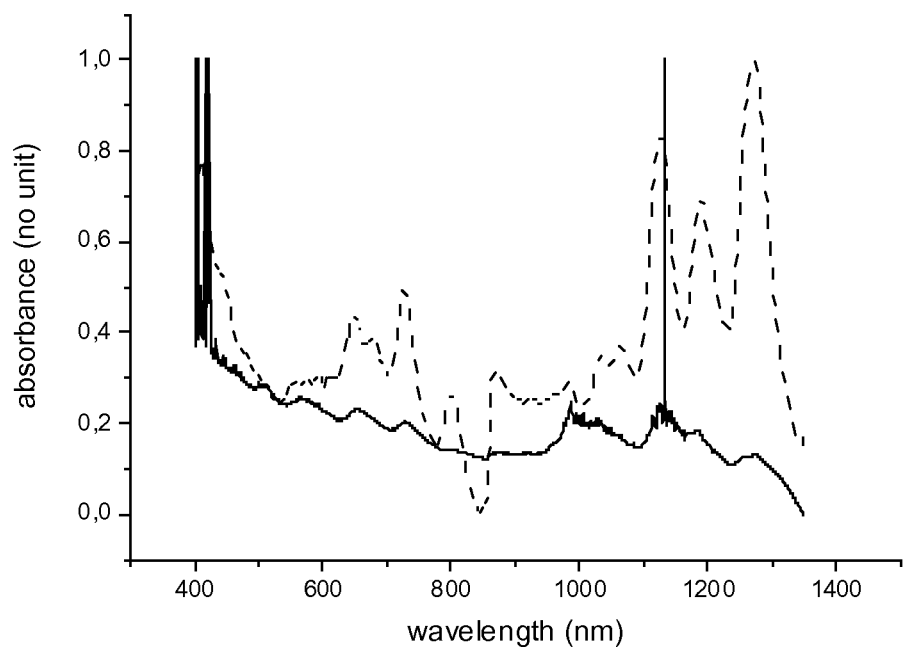

The separation was carried out similarly to example 2.1. However, only one SPT layer was used (25% by weight of SPT), and PAE2 was used as surfactant instead of PAE1. The SPT/PAE2 solution was set to pH 1.9 with HCl. After centrifugation, like in example 2.1, all tubes contained a bluish layer in the top zone of the tubes, a middle zone without any specific color (the color of the SPT solution) and a dark layer at the bottom of the tubes. The bluish fraction was purified in analogy to example 2.1 and analyzed via UV/Vis/NIR. As FIG. 4 shows, essentially no metallic SWNTs are present. Thus, the bluish layer contains virtually only semi-conducting SWNTs.

Example 2.6

The separation was carried out similarly to example 2.5. However, instead of surfactant PAE2, Tamol® NN9401, a condensation product of 2-naphthylsulfonic acid and formaldehyde from BASF SE, Germany, was used, and the SPT/Tamol solution was set to pH 1.5 with HCl. Here, after centrifugation, the tubes contained a reddish-brown layer in the top zone of the tubes, a middle zone without any specific color (the color of the SPT solution) and a dark layer at the bottom of the tubes. The reddish-brown fraction was purified in analogy to example 2.1 and analyzed with UV/Vis/NIR. The spectra proved that this fraction was significantly depleted of semi-conducting SWNTs and contained essentially metallic SWNTs.

Example 2.7

Figure 5:
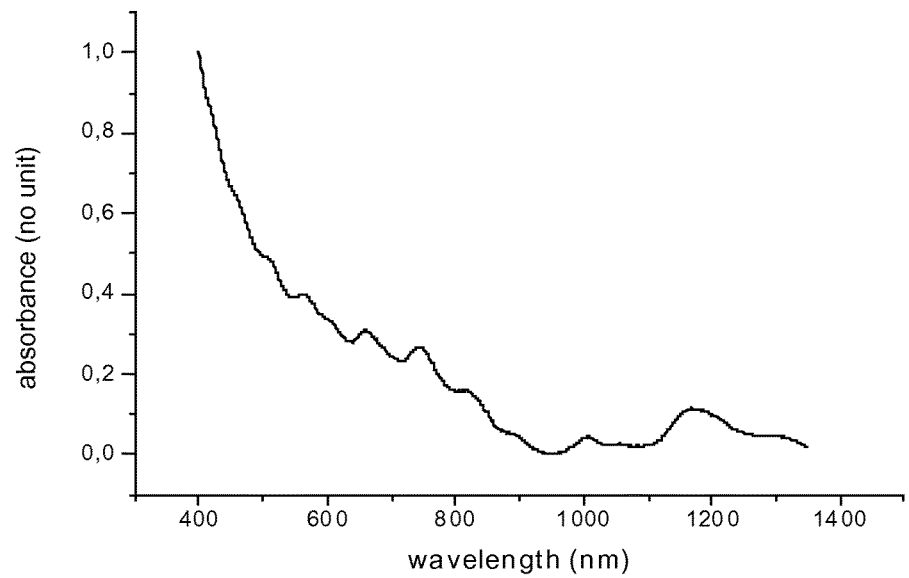
FIG. 5 shows the UV/Vis/NIR spectrum of the reddish-brown layer obtained in example 2.7.

The separation was carried out similarly to example 2.6. However, instead of surfactant Tamol® NN9401, Glydol® N1055, a polyarylsulfonate from Zschimmer & Schwarz, Germany, was used. Here, after centrifugation, the tubes contained a reddish layer in the top zone of the tubes, a middle zone without any specific color (the color of the SPT solution) and a dark layer at the bottom of the tubes. The reddish fraction was purified in analogy to example 2.1 and analyzed with UV/Vis/NIR. As FIG. 5 shows, this fraction contains essentially metallic SWNTs.

3. Application Examples 3.1 Transistors with Semi-Conducting SWNTs from Example 2.1

Transistors measurements provide a simple method for performance analysis of the separation of semiconducting SWCNTs from metallic ones. For purely semi-conducting samples, high On/Off ratios are typically observed. On the contrary, metallic impurities limit the On/Off ratio by creating short-circuits, which lead to stable currents that flow between source and drain electrodes; thus decreasing the On/Off ratio.

Drop Casting Nanotubes onto a Si/SiO$_2$ or Si/Al$_2$O$_3$ Wafer

For the testing the wafers consisting of degenerately doped Si with an insulator (either SiO$_2$ or Al$_2$O$_3$) were equipped with gold contacts by vaporizing gold contacts through shadow masks onto the respective dielectric surface. A shadow mask was used to create multiple possible channels of same length and width to enable a variety of possible channels that can be easily compared. The wafers as produced were cut into 2×2 cm pieces. Drop casting denotes in this context the process of depositing single drops using a 1 ml syringe with needle (Braun 4657519) of the extracted aqueous SWNTs bands (from example 2.1) onto the Si-wafer. To do so, the wafers were placed on a hot plate and heated to approximately 70° C., thus causing the water of the single drops to evaporate slowly (within about 5 min). After each drop and dry step the wafer was dipped into deionized water to eliminate residual surfactant and SPT particles. The wafers were additionally dipped into a beaker with deionized water and dried by placing a piece of drying paper near the surface to lead the water cautiously off the surface. In the following step the wafers were placed back on the hot plate to completely remove remaining trace amounts of water. A percolating network resulted after 0.2 ml had been deposited in a drop-wise manner.

For all experiments, two opposing gold contacts (channel width: 100 µm channel length: 200 µm) were contacted as source and drain. The Si side of the Si/SiO$_2$ or Si/Al$_2$O$_3$ wafer was contacted as the gate electrode. The voltage between source and drain was −1V and the voltage between the channel and the gate was varied between +8 V and −8 V. The mobility was determined to be 1 cm$^2$/Vs and the On/Off ratio was found to be 5E4 (see FIGS. 6 and 7).

Figure 6:
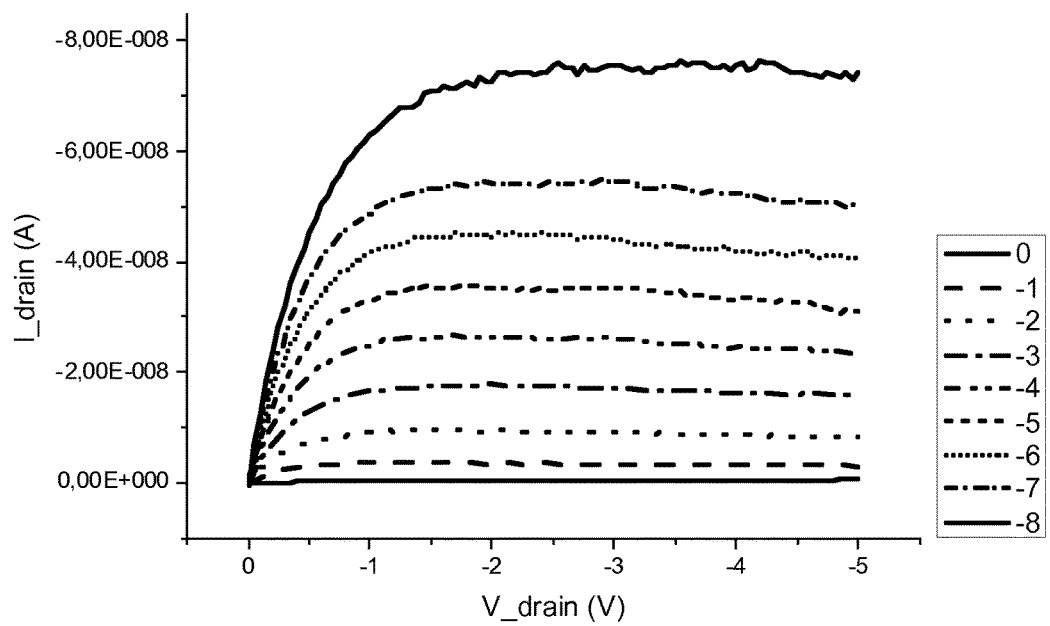
FIG. 6 shows the input curve of the transistor prepared in example 3.1.
Figure 7:
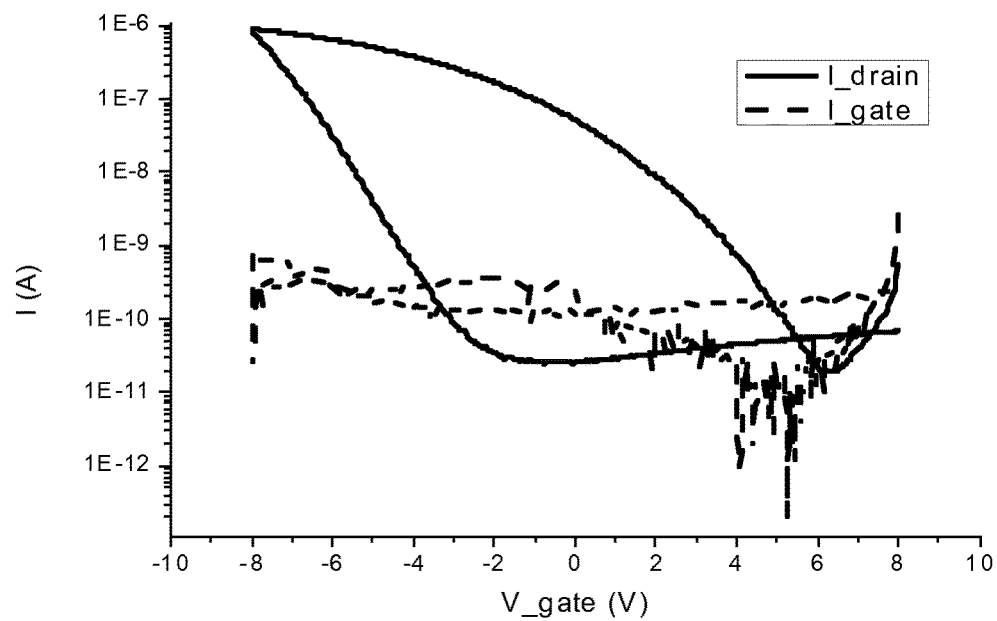
FIG. 7 shows the output curve of the transistor prepared in example 3.1.

The characteristic transistor curves are shown in FIGS. 6 and 7. These results confirm that the semi-conducting SWNTs from example 2.1 are highly enriched and suitable as active material in transistor applications.

3.2 Transistors with Semi-Conducting SWNT Sheet from Example 2.2

Figure 8:
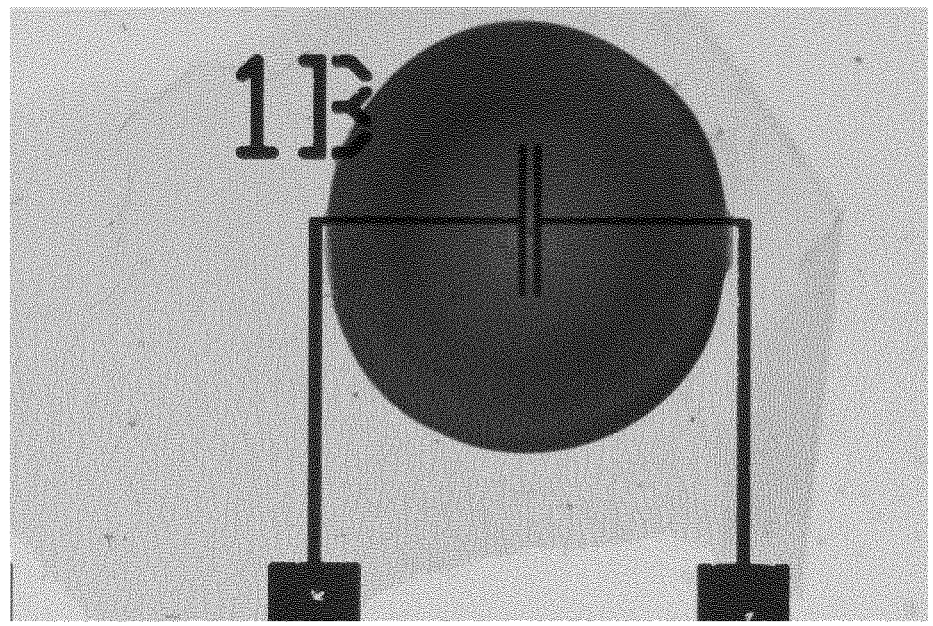
FIG. 8 shows a darkfield microscopic picture of a working FET of example 3.2 with SWNT sheet channel, top gold contacts and top ionic liquid gating. The nanotube sheet is overlapping itself in the lower right corner, but not in the channel.
Figure 9:
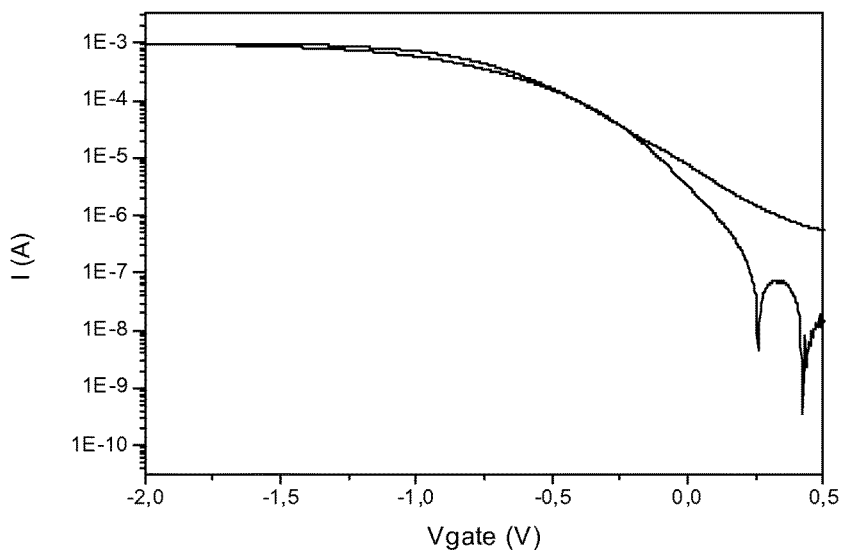
FIG. 9 shows the transfer curve of the transistor of example 3.2 with channel length of 50 μm.
Figure 10:
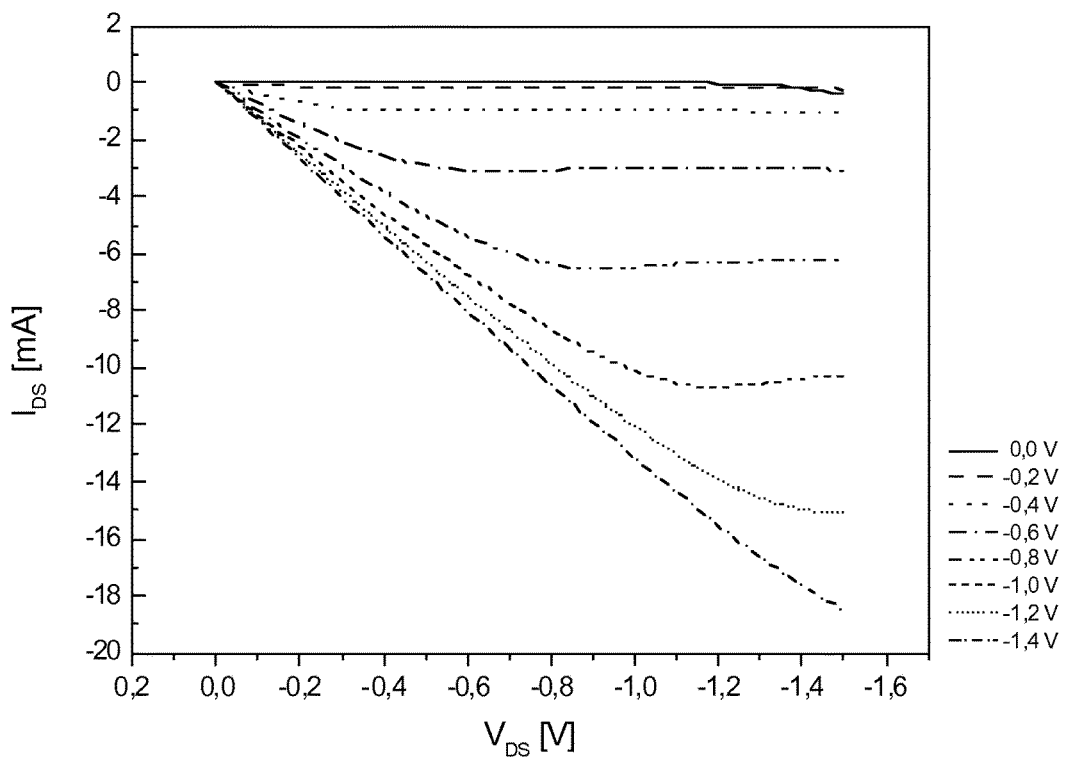
FIG. 10 shows the output curve of the transistor of example 3.2 with channel length of 50 μm.

The quartz substrate of example 3.1 with the sheet on it was also used for this experiment. Gold contacts were placed on top of the sheet as shown in FIG. 8. 50 nm thick gold contacts were evaporated through a shadow mask onto the SWCNT film to yield a 50 µm long, 1000 µm wide channel. A liquid gate material was placed directly over the channel partially overlapping the metal contacts (FIG. 8). FIGS. 9 and 10 show the transfer and the output curve for different applied voltages between source and drain. From the output curve it can be seen that for higher V$_{gs}$ the drain current ID saturates at higher V$_{ds}$. This can be ascribed to parasitic effects of contact resistance due to the top gate top contact geometry. The overall best performance measured with this transistor was 12.6 cm$^2$/Vs as mobility and 10E3 as the On/Off ratio using V$_{ds}$=−1V.

The invention claimed is:

1. A method for separating semi-conducting and metallic single-walled carbon nanotubes from each other and optionally from other carbonaceous material, or for separating semi-conducting single-walled carbon nanotubes or metallic single-walled carbon nanotubes from other carbonaceous material, the method comprising:
   contacting:
   a) a composition containing semi-conducting and metallic single-walled carbon nanotubes and optionally other carbonaceous material,
   b) a composition containing semi-conducting carbon nanotubes and other carbonaceous material, or
   c) a composition containing metallic single-walled carbon nanotubes and other carbonaceous material,
   with at least one surface-active compound and a solution of a polytungstate, to obtain a composition; and
   subjecting the obtained composition to a density separation treatment.

2. The method of claim 1, comprising:
   (i) dispersing a first composition containing the semi-conducting and/or metallic single-walled carbon nanotubes and optionally other carbonaceous material in a liquid medium containing at least one surface-active compound to obtain a dispersion;
   (ii) providing a solution of a polytungstate;
   (iii) placing the dispersion obtained in (i) on or into the solution provided in (ii) to obtain a second composition;
   (iv) submitting the second composition obtained in (iii) to the density separation treatment;
   (v) separating a fraction or fractions enriched in the semi-conducting single-walled carbon nanotubes from a fraction or fractions enriched in other carbonaceous material, or separating a fraction or fractions enriched in the metallic single-walled carbon nanotubes from a fraction or fractions enriched in other carbonaceous material; and
   (vi) optionally repeating (i) to (iv) with one or more of the fractions obtained in (v).

3. The method of claim 2, wherein in (i) the composition containing the semi-conducting and/or metallic single-walled carbon nanotubes is dispersed in the dispersion (i) in an amount of from 0.01 to 2% by weight, calculated as solid carbon matter, based on a total weight of the dispersion (i).

4. The method of claim 2, wherein in (i) the at least one surface-active compound is dispersed in the dispersion (i) in an amount of from 0.05 to 5% by weight, based on a total weight of the dispersion (i).

5. The method of claim 2, wherein the dispersing (i) comprises:
   providing a mixture containing the semi-conducting and/or metallic single-walled carbon nanotubes and optionally other carbonaceous material, water and at least one surface-active compound; and
   subjecting the mixture to an ultrasonic treatment.

6. The method of claim 1, wherein the polytungstate is sodium polytungstate.

7. The method of claim 1, wherein the solution of the polytungstate is an aqueous solution.

8. The method of claim 1, wherein the solution of the polytungstate contains at least one surface-active compound.

9. The method of claim 1, wherein the solution of the polytungstate has at least one zone with a density which corresponds to a density of a complex formed by the semi-conducting single-walled carbon nanotubes and the at least one surface-active compound, or has at least one zone with a density which corresponds to a density of a complex formed by the metallic single-walled carbon nanotubes and the at least one surface-ctive compound.

10. The method of claim 9, wherein the solution of the polytungstate has at least one zone with a density of from 1.05 to 1.3 g/cm$^3$.

11. The method of claim 1, wherein:
when the solution of the polytungstate has at least one zone with a pH of below 5, the density separation treatment is centrifugation, filtration, or sedimentation; and
when the solution of the polytungstate has a pH of at least 5, the density separation treatment is density gradient centrifugation.

12. The method of claim 1, wherein:
the density separation treatment is centrifugation;
one or more layers of the solution of the polytungstate are placed in a centrifugation tube on top of each other, such that when two or more layers are present, the layers have different densities and are placed in order of decreasing densities with the layer with the highest density at the bottom of the centrifugation tube and the layer with the lowest density at the top of the centrifugation tube; and
when the solution of the polytungstate has, or is to have, a pH of at least 5, two or more layers of the solution of the polytungstate are placed in the centrifugation tube.

13. The method of claim 12, wherein 1, 2, 3, 4 or 5 layers of the solution of the polytungstate are used.

14. The method of claim 12, wherein densities of the bottom layer and the top layer differ by at least 0.1 g/cm$^3$.

15. The method of claim 1, wherein the at least one surface-active compound is selected from the group consisting of a polyarylether, a polyarylsulfonate, a poly(alkyleneoxide) blockcopolymer, a condensation product of at least one arylsulfonic acid, at least one aldehyde and optionally at least one other compound different from the arylsulfonic acid and aldehyde which is capable of undergoing condensation with the arylsulfonic acid and/or the aldehyde; and a salt thereof.

16. The method of claim 15, wherein in case that the semi-conducting single-walled carbon nanotubes are to be obtained, the surface-active compound is a polyarylether containing a phosphate group —O—P(=O)(OR)$_2$ and/or a phosphonate group —O—P(=O)(R')OR, where each R is independently hydrogen, a cationic equivalent, $C_1$-$C_4$-alkyl, or optionally substituted phenyl; and R' is $C_1$-$C_4$-alkyl or phenyl.

17. The method of claim 16, wherein the surface-active compound is a polyarylether having a backbone formed by 2 or more aryl groups selected from the group consisting of a phenyl ring and a naphthyl ring bound to each other via at least one $C_1$-$C_5$-alkylene group as a linking group, where at least a part of the aryl groups carry one or more ether groups of formula —O-A-$_x$-Y, wherein each A is independently $C_2$-$C_5$-alkylene, each x is independently 1 to 50, in a first part of the ether groups Y is OH, in a second part of the ether groups Y is —O—P(=O)(OR)$_2$, and in a third part of the ether groups Y is —O—S(=O)$_2$OR, —O—S(=O)$_2$—R', —O—P(=O)(R')OR, —O—C(=O)—R' or —O—C(=O)—OR, where each R is independently hydrogen, $C_1$-$C_4$-alkyl, optionally substituted phenyl, or a cationic equivalent and R' is $C_1$-$C_4$-lkyl or phenyl.

18. The method of claim 17, where the polyarylether is obtained by a process comprising:
obtaining a condensation product of:
(1) at least one monohydroxyaromatic derivative in which the hydroxyl group is etherified with a $C_2$-$C_5$-alkyl group which carries a phosphate group —O—P(=O)(OR)$_2$, with each R being independently H, a cationic equivalent, $C_1$-$C_4$-alkyl or optionally substituted phenyl;
(2) at least one monohydroxyaromatic derivative in which the hydroxyl group is etherified by reaction with at least one diol precursor selected from the group consisting of ethylene oxide, propylene oxide, tetrahydrofuran and 1,2-pentylene oxide;
(3) at least one monohydroxyaromatic compound carrying one or more $C_4$-$C_{20}$-alkyl groups; and
(4) an aldehyde source; and
optionally partially or completely neutralizing the condensation product.

19. The method of claim 18, wherein:
the at least one monohydroxyaromatic derivative (1) is obtained by reacting phenoxyethanol and phosphoric acid or polyphosphoric acid;
the at least one monohydroxyaromatic derivative (2) is obtained by reacting phenol and ethylene oxide;
component (3) is dodecylphenol; and
component (4) is a formaldehyde source.

20. The method of claim 18, wherein the at least one monohydroxyaromatic derivative (1) is used in a molar excess to an overall amount of (2) and (3).

21. The method of claim 15, wherein in case that the metallic single-walled carbon nanotubes are to be obtained, the surface-active compound is a polyarylsulfonate, a poly(alkyleneoxide) blockcopolymer, or a condensation product of at least one arylsulfonic acid, at least one aldehyde and optionally other compounds.

22. The method of claim 11, wherein the density separation treatment is centrifugation, which is carried out with a mean acceleration of from 100 to 300000 g.

23. A method for obtaining semi-conducting or metallic single-walled carbon nanotubes, the method comprising:
contacting a composition containing semi-conducting or metallic single-walled carbon nanotubes and undesired carbonaceous material with at least one surface-active compound and then with a solution of a polytungstate; and
subjecting the obtained composition to a density separation treatment.

* * * * *